(12) United States Patent
Asamura et al.

(10) Patent No.: US 8,986,448 B2
(45) Date of Patent: Mar. 24, 2015

(54) METHOD OF MANUFACTURING SINGLE CRYSTAL 3C-SIC SUBSTRATE AND SINGLE CRYSTAL 3C-SIC SUBSTRATE OBTAINED FROM THE MANUFACTURING METHOD

(75) Inventors: Hidetoshi Asamura, Ibaraki (JP); Keisuke Kawamura, Matsumoto (JP); Satoshi Obara, Funabashi (JP)

(73) Assignee: Air Water Inc. (JP)

( * ) Notice: Subject to any disclaimer, the term of this patent is extended or adjusted under 35 U.S.C. 154(b) by 0 days.

(21) Appl. No.: 13/638,070

(22) PCT Filed: Mar. 14, 2011

(86) PCT No.: PCT/JP2011/056518
§ 371 (c)(1),
(2), (4) Date: Oct. 23, 2012

(87) PCT Pub. No.: WO2011/122368
PCT Pub. Date: Oct. 6, 2011

(65) Prior Publication Data
US 2013/0040103 A1 Feb. 14, 2013

(30) Foreign Application Priority Data

Mar. 29, 2010 (JP) .................................. 2010-074013
Dec. 24, 2010 (JP) .................................. 2010-286949

(51) Int. Cl.
| C30B 29/36 | (2006.01) |
| H01L 21/02 | (2006.01) |
| C30B 25/02 | (2006.01) |

(52) U.S. Cl.
CPC ..... *H01L 21/0262* (2013.01); *Y10T 428/24355* (2015.01); *C30B 25/02* (2013.01);
(Continued)

(58) Field of Classification Search
USPC ...................................... 117/104, 86, 89, 109
See application file for complete search history.

(56) References Cited

U.S. PATENT DOCUMENTS 6,214,108 B1 * 4/2001 Okamoto et al. ............... 117/95

FOREIGN PATENT DOCUMENTS

| JP | 59-203799 A | 11/1984 |
| JP | 2002-338395 A | 11/2002 |

(Continued)

OTHER PUBLICATIONS

Machine Translation of JP 2002-338395 Nagasawa et al. Obtained from JPO website on Nov. 7, 2013.*

(Continued)

*Primary Examiner* — Bob M Kunemund
(74) *Attorney, Agent, or Firm* — Wood, Phillips, Katz, Clark & Mortimer

(57) ABSTRACT

To provide a method of manufacturing a single crystal 3C-SiC substrate that can dramatically reduce surface defects generated in a processing of epitaxial growth and can secure a quality as a semiconductor device while simplifying a post process. The method of manufacturing a single crystal 3C-SiC substrate where a single crystal 3C-SiC layer is formed on a base substrate by epitaxial growth is provided. A first growing stage of forming the single crystal 3C-SiC layer to have a surface state configured with a surface with high flatness and surface pits scattering in the surface is performed. A second growing stage of further epitaxially growing the single crystal 3C-SiC layer obtained in the first growing stage so as to fill the surface pits is performed.

18 Claims, 13 Drawing Sheets

(52) U.S. Cl.
CPC ........... *C30B 29/36* (2013.01); *H01L 21/0237* (2013.01); *H01L 21/02447* (2013.01); *H01L 21/02494* (2013.01); *H01L 21/02529* (2013.01); *H01L 21/02614* (2013.01); *H01L 21/02661* (2013.01)
USPC ................ 117/104; 117/86; 117/89; 117/109

(56) References Cited

FOREIGN PATENT DOCUMENTS

| JP | 2002338395 A | * | 11/2002 | ............. C30B 29/36 |
|---|---|---|---|---|
| JP | 2004-336079 A | | 11/2004 | |
| JP | 2006-228763 A | | 8/2006 | |
| JP | 2006-253617 A | | 9/2006 | |

OTHER PUBLICATIONS

Tomoaki Hatayama et al., "Low-temperature heteroepitaxy of 3C-SiC on Si using dimethylgermane", Extending abstracts, Japan Society of Applied Physics, Mar. 28, 1997, p. 283, 29a-SS-4.

Yuki Ishida et al., "Growth Mechanism of EC-SiC Heteroepitaxial Layer on Si Substratse and Its Schottky Barrier Characteristics", Bulletin of the Electrotechnical Laboratory, vol. 62, No. 10, 11, 1998, pp. 5-10.

International Preliminary Report on Patentability and Written Opinion of the International Searching Authority, PCT/JP2011/056518, issued Oct. 23, 2012.

* cited by examiner

EXAMPLE 1 SEM SURFACE, CROSS-SECTION

EXAMPLE 2 SEM SURFACE, CROSS-SECTION

EXAMPLE 3 SEM SURFACE, CROSS-SECTION

EXAMPLE 4 SEM SURFACE, CROSS-SECTION

EXAMPLE 5 SEM SURFACE, CROSS-SECTION

EXAMPLE 6 SEM SURFACE, CROSS-SECTION

EXAMPLE 7 SEM SURFACE, CROSS-SECTION

COMPARATIVE EXAMPLE 8

COMPARATIVE EXAMPLE 9

COMPARATIVE EXAMPLE 10 SEM SURFACE, CROSS-SECTION

COMPARATIVE EXAMPLE 11 SEM SURFACE, CROSS-SECTION

COMPARATIVE EXAMPLE 12 SEM SURFACE, CROSS-SECTION

COMPARATIVE EXAMPLE 13 SEM SURFACE, CROSS-SECTION

COMPARATIVE EXAMPLE 14 SEM SURFACE, CROSS-SECTION

COMPARATIVE EXAMPLE 15 SEM SURFACE, CROSS-SECTION

COMPARATIVE EXAMPLE 16 SEM SURFACE, CROSS-SECTION

EXAMPLE 19 SEM SURFACE, CROSS-SECTION

METHOD OF MANUFACTURING SINGLE CRYSTAL 3C-SIC SUBSTRATE AND SINGLE CRYSTAL 3C-SIC SUBSTRATE OBTAINED FROM THE MANUFACTURING METHOD

TECHNICAL FIELD

The present invention relates to a method of manufacturing a single crystal 3C (cubic system)-SiC substrate that can dramatically reduce surface defects, and relates to a single crystal 3C-SiC substrate obtained from the manufacturing method.

RELATED ART

Single crystal SiC (silicon carbide) excels in thermal and chemical stability, is high in mechanical strength, and is not damaged easily from irradiation of radioactive rays. Due to these properties, it has attracted attention as a semiconductor device material for the next generation. Further, single crystal SiC has a close number of lattice constant to GaN, and thus, it can also be used as foundation substrates where GaN is grown.

Conventionally, as methods of obtaining single crystal SiC, methods of obtaining SiC bulk substrates obtained from the sublimation method and methods of heteroepitaxially growing single crystal 3C-SiC on an Si substrate or an SOI substrate have been performed. As for the methods of epitaxially growing on the Si substrate or the SOI substrate, methods have been proposed in which the Si substrate or the SOI substrate is carbonized to be converted into an SiC thin film and single crystal 3C-SiC is grown by using silane-based gas and carbon hydride gas, so that SiC is suppressed from becoming amorphous or being polycrystallized.

The existence of defects in single crystal SiC causes degradation of performance of single crystal SiC when it is used as the semiconductor device, and even when it is used as a foundation substrate of a GaN layer, causes a degradation of a quality of the GaN layer. Therefore, high quality single crystal SiC substrates with fewer defects as possible have been required.

REFERENCE DOCUMENT(S) OF CONVENTIONAL ART

Patent Documents

Patent Document 1: JP2003-212694A
Patent Document 2: JP2004-039766A
Patent Document 3: JP2006-228763A
Patent Document 4: JP2007-284298A
Patent Document 5: JP2009-256138A Non-Patent Document Non-patent Document 1: "Mechanism of Epitaxial Growth", (written and edited by) Kazuo Nakajima, Kyoritsu Shuppan Co., Ltd., 2002

SUMMARY OF THE INVENTION

Problems to be Solved by the Invention

However, when growing single crystal SiC by the epitaxial growth, there is a problem that defects easily occur in the surface of single crystal SiC in the process of epitaxial growth.

FIG. 1 is a graph showing a relation that a growing speed in general epitaxial growing reaction depends on a temperature when a flow rate of reaction gas and a reaction pressure are under the same condition. Note that, in the graph, the lateral axis is defined as an inversed number of an absolute temperature, and the right side is a low temperature side and the left side is a high temperature side. Moreover, in the graph, the vertical axis is an epitaxial growing speed, the lower side is a low speed side, and the upper side is a high speed side.

As seen from the graph, when the condition of the flow rate and the pressure is fixed in the epitaxial growth, there exist a surface reaction rate-limited range where the growing speed rapidly accelerates within a low temperature range according to the temperature increase, a transport rate-limited range located on the higher temperature side than the surface reaction rate-limited range and where the increase of the growing speed according to the temperature increase is extremely small (i.e., temperature dependency is low), and a desorption rate-limited range located on the higher temperature side than the transport rate-limited range and where the growing speed rapidly decelerates according to the temperature increase (the above described Non-patent Document 1).

Within the surface reaction rate-limited range described above, a chemical reaction speed dominates the growing speed. When single crystal 3C-SiC was grown with the reaction rate-limit, the crystallinity of single crystal 3C-SiC was poor, the surface state was rough, and realistically, a quality appropriate for manufacturing the semiconductor device could not be obtained. Moreover, within the desorption rate-limited range, material molecules attach to locations other than the substrate and this causes a degraded material supply efficiency and easier desorption of the material molecules which reached the substrate surface. Therefore, when single crystal 3C-SiC was grown with the desorption rate-limit, the crystallinity was improved compared to the surface reaction rate-limited range but a part of the crystal core grew abnormally and multiple protrusions grew on the surface, resulting in a rough surface state and the quality appropriate for manufacturing the semiconductor device again could not be obtained.

Therefore, by fixing the flow rate condition of the supply gas and a filming pressure and adjusting a filming temperature higher or lower, the rate-limiting stage of the film formation can arbitrarily be selected.

Further, it has also been known that if the filming temperature and pressure are fixed and the flow rate of the supply gas is reduced, similar to when increasing the filming temperature, the rate-limiting stage changes from the reaction rate-limit to the transport rate-limit, and further to the desorption rate-limit (the above described Non-patent Document 1). By using this, by fixing the filming temperature and the filming pressure and adjusting the flow rate of the supply gas, the rate-limiting stage of the film formation can arbitrarily be selected.

Moreover, the present inventors have found that if the filming temperature and the flow rate condition of the supply gas are fixed and the filming pressure is reduced, similar to when increasing the filming temperature, the rate-limiting stage changes from the reaction rate-limit to the transport rate-limit, and further to the desorption rate-limit. By using this, through fixing the filming temperature and the flow rate condition of the supply gas and adjusting the filming pressure higher or lower, the rate-limiting stage of the film formation can arbitrarily be selected.

On the other hand, within the transport rate-limited range within the middle temperature range, the growth progresses with the domination by the material molecule diffusion process, and the reaction speed is sufficiently fast but the dependency of the growing speed on the temperature is relatively small.

Therefore, when the single crystal 3C-SiC substrate is manufactured as the foundation substrate of the semiconductor device or GaN, there has been no choice but to use the transport rate-limited range as the condition of epitaxial growth.

However, within the transport rate-limited range, although the surface roughness due to the crystallinity as within the surface reaction rate-limited range is not caused and the protrusions on the surface as within the desorption rate-limited range is not generated, a problem that multiple tiny pit defects are formed could not be avoided.

Thus, when the tiny pit defects are generated on the surface of the single crystal 3C-SiC layer in the process of epitaxial growth, a post-process of removing the defects, such as a grinding process, is required in some cases. With more processes, the cost-up for the processes is inevitable, and this increases factors influencing on the quality, and thus, causes disadvantage in terms of a quality stability, an yield rate, or the like.

Each of the above described Patent Documents discloses that the epitaxial growth is performed at plural levels of temperature. However, none of them refers to pits generated in the epitaxial growth process as described above, and they cannot sufficiently prevent the surface defects due to pits.

The present invention is made in view of the above situations, and has an object to provide a method for manufacturing a single crystal 3C-SiC substrate that can dramatically reduce surface defects generated in the epitaxial growing process and can secure the quality as the semiconductor device while simplifying a post-process, and a single crystal 3C-SiC substrate obtained from the manufacturing method.

Means for Solving the Problem

In order to achieve the above object, a method of manufacturing a single crystal 3C-SiC substrate where a single crystal 3C-SiC layer is formed on a base substrate by epitaxial growth according to an aspect of the invention includes a first growing stage of forming the single crystal 3C-SiC layer to have a surface state configured with a surface with high flatness and surface pits scattering in the surface, and a second growing stage of further epitaxially growing the single crystal 3C-SiC layer obtained in the first growing stage so as to fill the surface pits.

In order to achieve the above object, a single crystal 3C-SiC substrate according an aspect of the invention is formed with a single crystal 3C-SiC layer on a base substrate by epitaxial growth. The number of defects due to surface pits existing in a surface of the single crystal 3C-SiC layer is $8 \times 10^6/cm^2$ or lower in a state immediately after the epitaxial growth.

Effects of the Invention

Thus, in the method of manufacturing the single crystal 3C-SiC substrate of the aspect of the invention, the first growing stage of epitaxially growing the single crystal 3C-SiC layer to have a surface state formed with surface pits in a surface with high flatness is performed, and the second stage of further epitaxial growing the single crystal 3C-SiC layer obtained in the first growing stage to fill the surface pits in the surface thereof is performed. Thus, the single crystal 3C-SiC layer formed with the surface pits and having a surface form secured in flatness in a part other than the surface pits is formed in the first growing stage, and in the second growing stage, the single crystal 3C-SiC layer with a flat surface is formed by filling the surface pits to reduce the surface pits while maintaining the flatness of the surface. According to the above, because defects due to the surface pits generated in the surface of the single crystal 3C-SiC layer in the process of epitaxial growth are reduced, a post-process is simplified, the cost is accordingly reduced, it becomes advantageous in terms of a quality stability, a yield rate and the like by reducing a influence factor on the quality, and the quality as a semiconductor device and the like can be secured.

Further, in the single crystal 3C-SiC substrate according to the aspect of the invention, the number of the defects due to the surface pits existing in the surface of the single crystal 3C-SiC layer is $8 \times 10^6/cm^2$ or lower in a state immediately after the epitaxial growth. Therefore, because defects due to the surface pits generated in the surface of the single crystal 3C-SiC layer in the process of the epitaxial growth are reduced, the post-process is simplified, the cost is accordingly reduced, it becomes advantageous in terms of the quality stability, the yield rate and the like by reducing the influence factor on the quality, and the quality as the semiconductor device and the like can be secured.

In the aspect of the invention, when the epitaxial growth is performed within a transport rate-limited range in the first growing stage, and the epitaxial growth is performed within a desorption rate-limited range in the second growing stage, in the transport rate-limited range, an abnormal growth of a crystal core which becomes the cause of defects is suppressed, and a single crystal 3C-SiC layer having a surface form with scattered surface pits in the flat surface and good crystallinity can be obtained stably in high growing speed. Further, in the desorption rate-limited range, instead of protrusions growing as the conventional case, single crystal 3C-SiC grows to fill the surface pits formed in the growth in transport rate-limit and the flatness of the flat surface is also maintained. Thus, the growth with the maintenance of flatness while filling the surface pits can be performed, and a single crystal 3C-SiC layer with good flatness and reduced dramatically in surface defects can be formed.

In the aspect of the invention, when the switch from the first growing stage to the second growing stage is performed by at least any one of a reduction of a material gas flow rate, a reduction of a filming pressure, and an increase of a substrate temperature, by performing the switch from the first growing stage to the second growing stage through reducing the material gas flow rate, the switch can smoothly be performed by only reducing the flow rate without changing the pressure or the temperature which comparatively takes time in changing its setting.

By performing the switch from the first growing stage to the second growing stage through reducing the filming pressure, the switch can be performed by only reducing the pressure without changing the temperature which comparatively takes time in changing its setting. Further, because the flow rate of the material gas is not changed, the atmosphere in which the epitaxial growth is performed is further stabilized, and the growth of the single crystal 3C-SiC layer is performed stably.

By performing the switch from the first growing stage to the second growing stage through increasing the substrate temperature, because the flow rate of the material gas is not changed, the atmosphere in which the epitaxial growth is performed is further stabilized, and the growth of the single crystal 3C-SiC layer is performed stably.

In the aspect of the invention, when a base substrate configured with semiconductor crystals containing Si in at least its surface layer part is used, a single crystal 3C-SiC layer having good crystallinity and reduced dramatically in surface defects can be formed on the base substrate of which at least the surface layer part is comprised of the semiconductor crystals containing Si, and a single crystal 3C-SiC substrate secured in its quality as a semiconductor device can be manufactured at low cost.

In the aspect of the invention, when a base substrate comprised of Si in at least its surface layer part is used, Si of the surface layer part of the base substrate is carbonized to be converted into an SiC layer, and the epitaxial growths of the first and second growing stages are performed by having the SiC layer as a seed layer, a single crystal 3C-SiC layer having good crystallinity and reduced dramatically in the surface defects can be formed on the base substrate of which at least the surface layer part is comprised of Si, and a single crystal 3C-SiC substrate secured in its quality as the semiconductor device can be manufactured at low cost.

In the aspect of the invention, when a thickness of the single crystal 3C-SiC layer formed in the first growing stage is 500 nm or more and a thickness of the single crystal 3C-SiC layer formed in the second growing stage is 500 nm or more, if the thickness of the single crystal 3C-SiC layer formed in the first growing stage is below 500 nm, the part where the surface pits are formed to scatter in the flat surface will have a state in which 3C-SiC will not be formed efficiently and the base substrate will be exposed, and the surface pits will not be able to be filled by 3C-SiC even through the subsequent second growing stage. Therefore, by having the thickness of the single crystal 3C-SiC layer formed in the first growing stage to be 500 nm or more, the surface pits are filled in the subsequent second growing stage to resolve defects, and a single crystal 3C-SiC layer with less defects while securing the flatness can be obtained.

If the thickness of the single crystal 3C-SiC layer formed in the second growing stage is below 500 nm, the surface pits formed to scatter in the flat surface in the first growing stage will not be filled efficiently in the second growing stage. Therefore, by having the thickness of the single crystal 3C-SiC layer formed in the second growing stage to be 500 nm or more, the surface pits formed in the first growing stage are filled to resolve the defects, and a single crystal 3C-SiC layer with less defects while securing the flatness can be obtained.

In the aspect of the invention, when the thickness of the single crystal 3C-SiC layer formed in the first growing stage is 900 to 2900 nm, and the thickness of the single crystal 3C-SiC layer formed in the second growing stage is 700 to 3700 nm, in the first growing stage, a single crystal 3C-SiC layer can be formed so that surface pits that can be resolved in the second growing stage scatter in the surface with efficient flatness, and a single crystal 3C-SiC layer with less defects while securing the flatness can be obtained.

In the second growing stage, the surface pits formed in the first growing stage are filled to resolve defects, and a single crystal 3C-SiC layer with less defects while securing the flatness can be obtained.

In the aspect of the invention, when a main component of the material gas is monomethylsilane when the single crystal 3C-SiC layer is formed on the base substrate by the epitaxial growth, monomethylsilane is gas with low dangerousness such as explosion, and it extremely excels in terms of low dangerousness even when an operation of a gas supply valve, an operation of an exhaust valve, or an operation of a heater output are performed during the film formation.

In the aspect of the invention, when, in the first growing stage, a substrate temperature is between 970 and 1120° C., a flow rate of monomethylsilane to be contained in the material gas is between 1.0 and 30.0 sccm per wafer, and a filming pressure exceeds $9 \times 10^{-6}$ Torr and is $4 \times 10^{-1}$ Torr or below, and when, in the second growing stage, the flow rate of monomethylsilane to be contained in the material gas is 6.0 sccm or lower per wafer, the substrate temperature is between 1100° C. and below a melting temperature of the base substrate, and the filming pressure is between $1 \times 10^{-7}$ and $6 \times 10^{-5}$ Torr, a growing efficiency of the epitaxial growth is secured, and a single crystal 3C-SiC layer reduced dramatically in the surface defects can be manufactured with good productivity. Further, by having the filming pressure in the first growing stage to be $4 \times 10^{-1}$ Torr or lower, discharge degradation of a resistance heater for heating a growing chamber can be suppressed.

In the aspect of the invention, when the material gas to be supplied when forming the single crystal 3C-SiC layer on the base substrate by the epitaxial growth is monomethylsilane only, the substrate temperature is between 990 and 1100° C., the flow rate of monomethylsilane per wafer is between 2.0 and 10.0 sccm, and the filming pressure is between $3 \times 10^{-5}$ and $1 \times 10^{-1}$ Torr in the first growing stage, and the flow rate of monomethylsilane per wafer is 3.0 sccm or lower in the second growing stage, the growing efficiency of the epitaxial growth can be secured, and the single crystal 3C-SiC layer reduced dramatically in the surface defects can be manufactured with good productivity.

In the aspect of the invention, when filming pressure is $1 \times 10^{-4}$ Torr or lower in the first growing stage and the switch from the first growing stage to the second growing stage is performed by either one of the reduction of the material gas flow rate and the increase of the substrate temperature, the growing efficiency of the epitaxial growth can be secured, and the single crystal 3C-SiC layer reduced dramatically in the surface defects can be manufactured with good productivity.

In the aspect of the invention, when filming pressure is $1 \times 10^{-1}$ Torr or higher in the first growing stage and the switch from the first growing stage to the second growing stage is performed by at least the reduction of filming pressure, the growing efficiency of the epitaxial growth can be secured, and the single crystal 3C-SiC layer reduced dramatically in the surface defects can be manufactured with good productivity.

In the aspect of the invention, when a main surface orientation of the single crystal 3C-SiC layer formed by the epitaxial growth on the base substrate is (111), a single crystal 3C-SiC layer of which the main surface orientation is (111) with less defects while securing the flatness can be obtained, and a single crystal 3C-SiC substrate secured in its quality as the semiconductor device can be manufactured at low cost.

Here, "the transport rate-limit", "the desorption rate-limit", and "the reaction rate-limit" in the aspects of the invention and the description thereof are respectively defined as follows.

The transport rate-limit: a substrate temperate range where a filming speed of 90% or more of a maximum filming speed obtained in the epitaxial growth under the same condition in the material gas, the atmosphere, the flow rate and the pressure can be obtained.

The desorption rate-limit: within a substrate temperature range where a filming speed of below 90% of the maximum filming speed obtained in the epitaxial growth under the same condition in the material gas, the atmosphere, the flow rate and the pressure can be obtained, the substrate temperate range on a higher temperature side of the transport rate-limit.

The reaction rate-limit: within the substrate temperature range where a filming speed of below 90% of the maximum filming speed obtained in the epitaxial growth under the same condition in the material gas, the atmosphere, the flow rate and the pressure can be obtained, the substrate temperate range on a lower temperature side of the transport rate-limit.

MODES FOR CARRYING OUT THE INVENTION

Next, modes for carrying out the present invention will be described.

Figure 2:
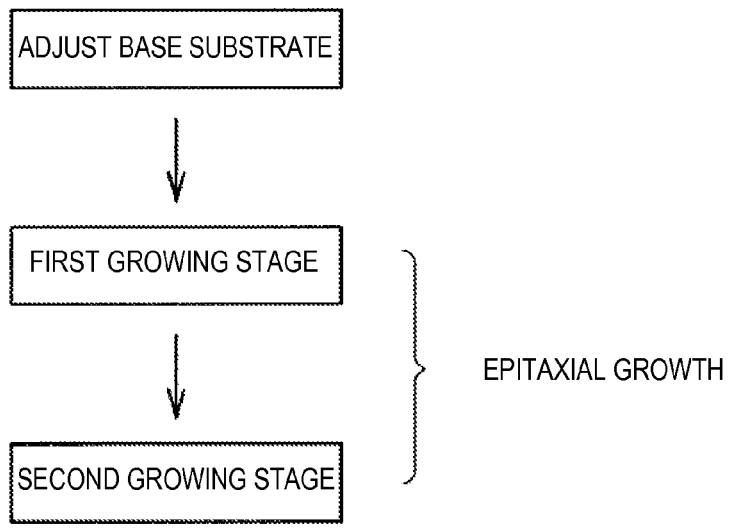
FIG. 2 is a process chart showing a method of manufacturing a single crystal 3C-SiC substrate of the invention.

FIG. 2 is a process chart showing an embodiment of a method of manufacturing a single crystal 3C-SiC substrate of the invention.

The method of the invention is a method of manufacturing a single crystal 3C-SiC substrate by first adjusting a base substrate to serve as a base for forming a single 3C-SiC layer by epitaxial growth, and forming the single crystal 3C-SiC layer on the base substrate by the epitaxial growth.

Further, in the epitaxial growth, a first growing stage is performed in which the single crystal 3C-SiC layer is epitaxially grown to have a surface state having a surface with high flatness and surface pits scattering in the surface, and a second stage is performed in which epitaxial growth is further performed to fill the surface pits of the single crystal 3C-SiC layer obtained in the first growing stage.

The base substrate is not particularly limited and various kinds of substrates may be adopted as long as a 3C-SiC layer can be formed by the epitaxial growth. In the invention, particularly great effects can be obtained when a single crystal Si substrate or an SOI substrate is used as a base substrate.

Moreover, effects of the invention can also be obtained when using, for example, an MgO substrate, a hexagonal crystal SiC bulk substrate obtained from a sublimation method, a BP substrate, a sapphire substrate, a 3C-SiC self-standing substrate, a GaN substrate, a GaAs substrate, AlN substrate, an InN substrate, an SiGe substrate, or a SiGe on Insulator substrate, as the base substrate.

When performing an adjusting process of the base substrate, known cleanings, such as ammonia hydrogen peroxide cleaning, hydrochloric acid hydrogen peroxide cleaning, sulfate-hydrogen peroxide cleaning, dilution HF cleaning, ultrasonic acetone cleaning, and ultrasonic methanol cleaning, may suitably be combined to clean the surface of the substrate as needed before a converting process, an annealing process, and an epitaxial process which are described below. Further, for the base substrate including Si in its surface layer, an oxide film on the surface is removed. If the MgO substrate, the sapphire substrate, the BP substrate, the GaN substrate, the GaAs substrate, the AlN substrate, the InN substrate or the like is used as the base substrate, although the cleaning process such as above is usually unnecessary, it may be performed as needed.

If the hexagonal crystal SiC bulk substrate obtained from the sublimation method or the 3C-SiC self-standing substrate is used as the base substrate, in the adjusting process thereof, the base substrate is annealed in an epitaxial growth furnace for about 10 minutes at a substrate temperature of 1000° C. or higher in a vacuum atmosphere under a pressure below 1 Torr, for example. Alternatively, it is annealed for about 10 minutes at the substrate temperature of 1000° C. or higher in a hydrogen atmosphere under a normal pressure or while the pressure is reduced. Thus, the adjusting process of the base substrate ends, and a first film forming process is performed subsequently in the epitaxial growing furnace.

If the MgO substrate, the sapphire substrate, the BP substrate, the GaN substrate, the GaAs substrate, the AlN substrate, the InN substrate or the like is used as the base substrate, in the adjusting process thereof, firstly, the base substrate is annealed in the epitaxial growth furnace for about 10 minutes at the substrate temperature of 1000° C. or higher in the vacuum atmosphere under the pressure below 1 Torr, for example. Alternatively, it is annealed for about 10 minutes at the substrate temperature of 1000° C. or higher in the hydrogen atmosphere under the normal pressure or while the pressure is reduced. Here, the adjusting process of the base substrate may end and the first film forming process may be performed subsequently in the epitaxial growth furnace. Alternatively, a single crystal silicon layer with about 6 to 40 nm thickness is subsequently grown on the base substrate surface at the substrate temperature of 700° C. or higher, below the base substrate melting temperature in a silane-based gas atmosphere or a mixed atmosphere of silane-based gas and hydrogen under the normal pressure or while the pressure is reduced, for example. Subsequently, the single crystal silicon layer formed on the substrate surface is converted into a single crystal 3C-SiC layer through the similar process to the process of using an SOI substrate described below. The adjusting process of the base substrate ends here, and the first film forming process subsequently is performed in the epitaxial growth furnace.

For example, if a semiconductor substrate of which at least a surface layer part contains Si or a main component of Si such as an Si substrate, an SOI substrate, an SiGe substrate, an SiGe on Insulator substrate or the like is used as the base substrate, Si of the surface layer part of the base substrate or a semiconductor crystal of the surface layer part of which a main component is Si is carbonized to be converted in to a 3C-SiC layer. Thus, the first growing stage and the epitaxial growth that is a second growing stage can be performed by having the 3C-SiC layer as a seed layer. According to the above, a single crystal 3C-SiC layer having good crystallinity and reduced dramatically in surface defects can be formed on a base substrate of which at least a surface layer part contains Si, and a single crystal 3C-SiC substrate secured in its quality as a semiconductor device can be manufactured at low cost.

More specifically, an Si substrate or an SOI substrate may be used as the base substrate of which at least the surface layer part is comprised of Si.

Figure 3:
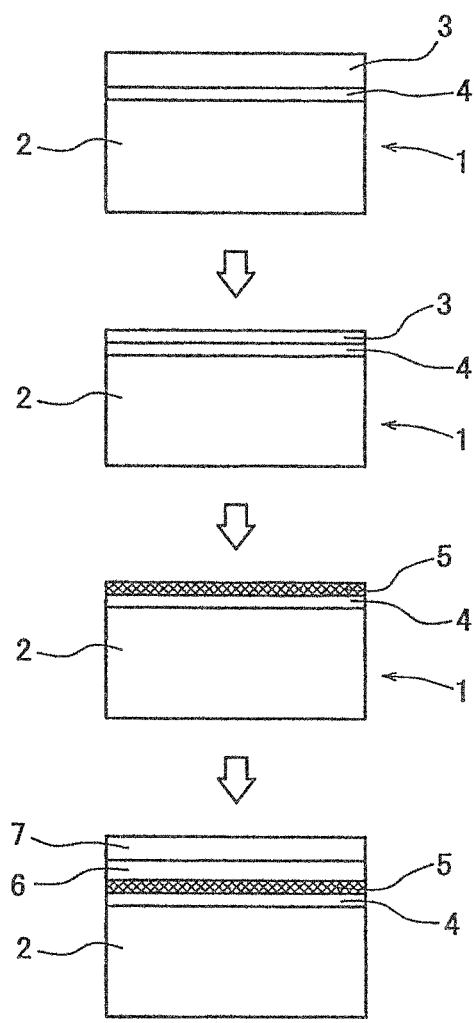
FIG. 3 shows views illustrating an example of an adjusting process of a base substrate.
Figure 4:
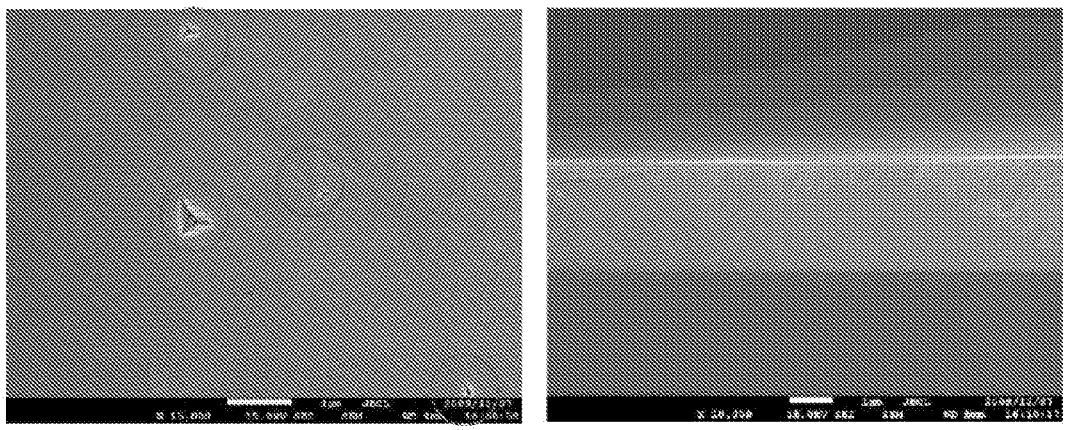
FIG. 4 is a surface SEM view and a cross-sectional SEM view of Example 1.
Figure 5:
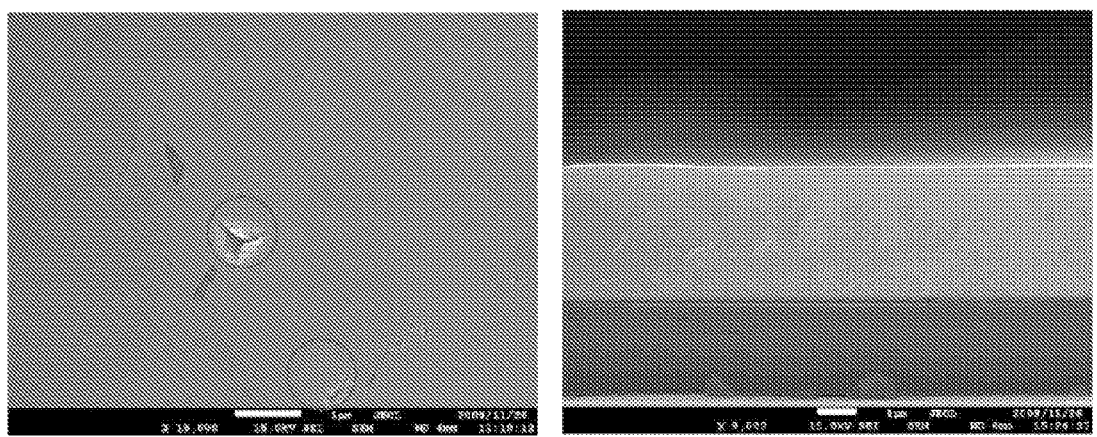
FIG. 5 is a surface SEM view and a cross-sectional SEM view of Example 2.
Figure 6:
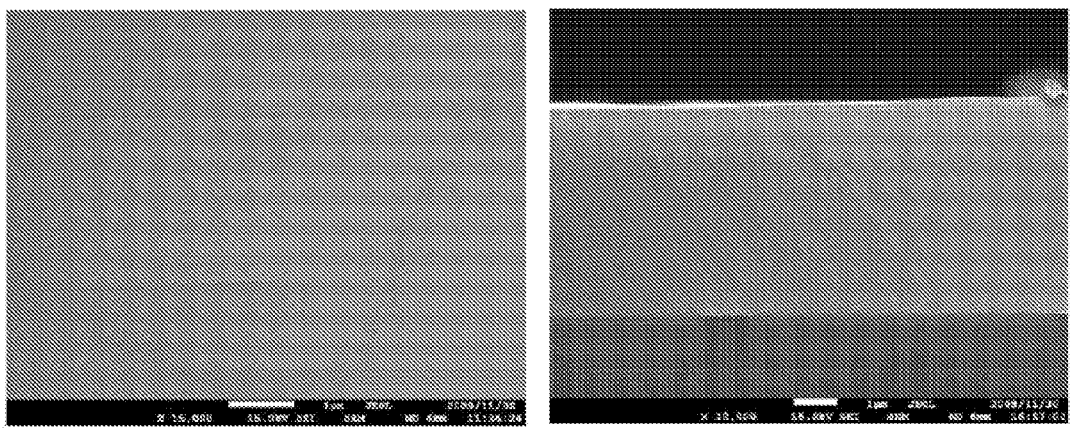
FIG. 6 is a surface SEM view and a cross-sectional SEM view of Example 3.
Figure 7:
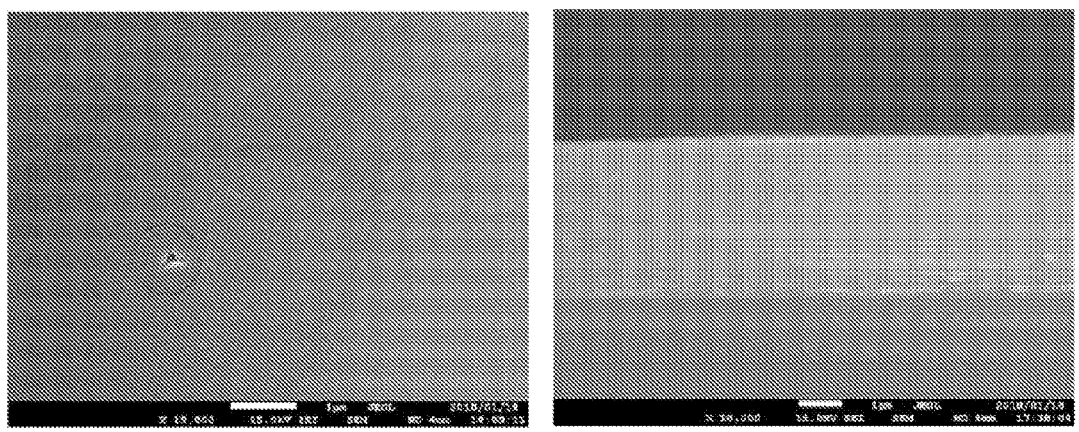
FIG. 7 is a surface SEM view and a cross-sectional SEM view of Example 4.
Figure 8:
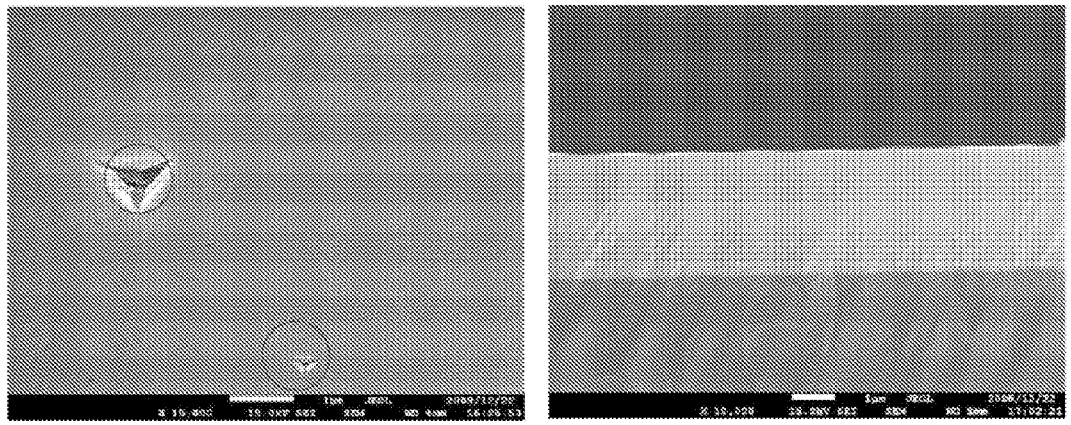
FIG. 8 is a surface SEM view and a cross-sectional SEM view of Example 5.
Figure 9:
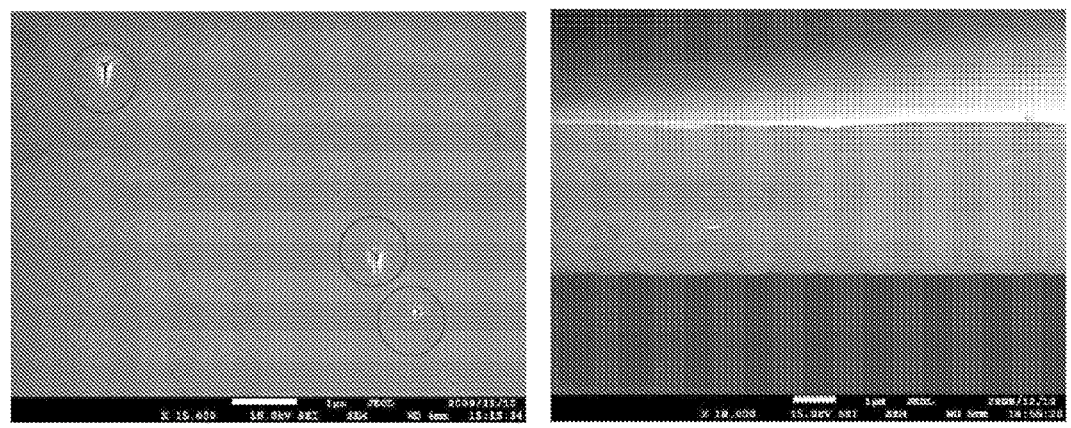
FIG. 9 is a surface SEM view and a cross-sectional SEM view of Example 6.
Figure 10:
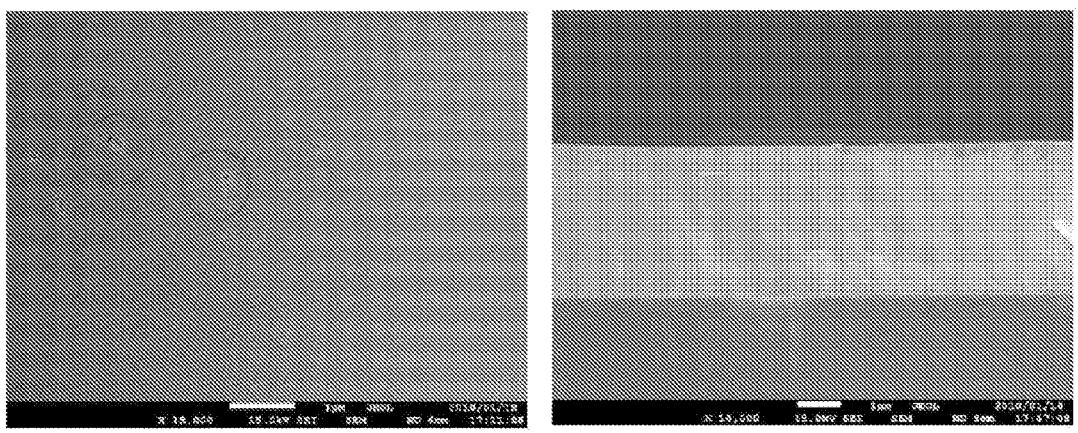
FIG. 10 is a surface SEM view and a cross-sectional SEM view of Example 7.
Figure 11:
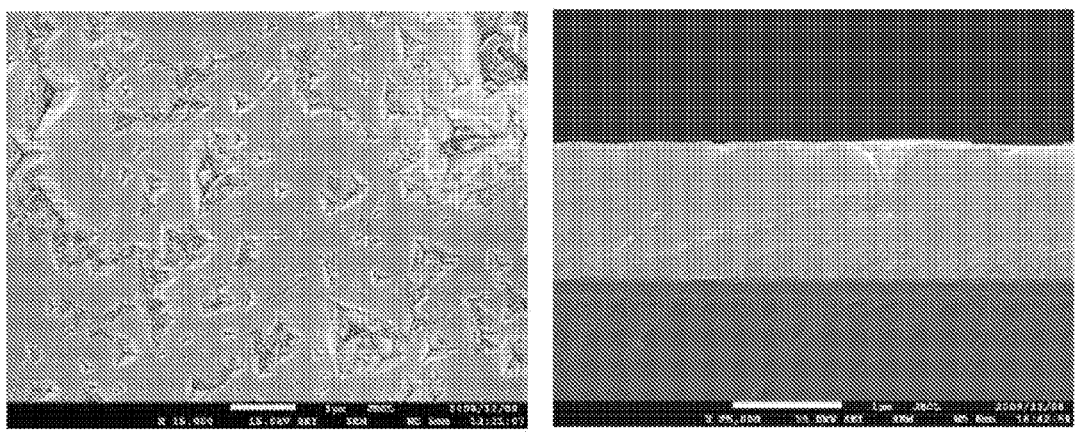
FIG. 11 is a surface SEM view and a cross-sectional SEM view of Comparative example 8.
Figure 12:
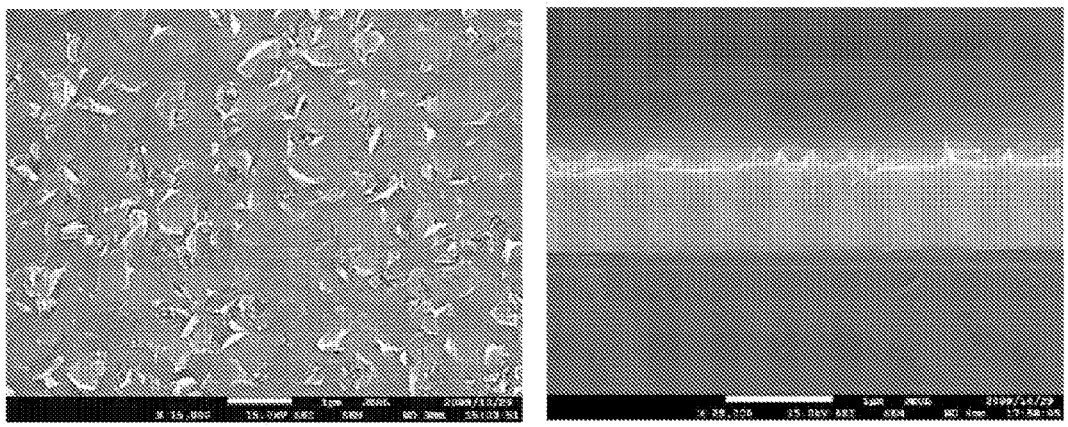
FIG. 12 is a surface SEM view and a cross-sectional SEM view of Comparative example 9.
Figure 13:
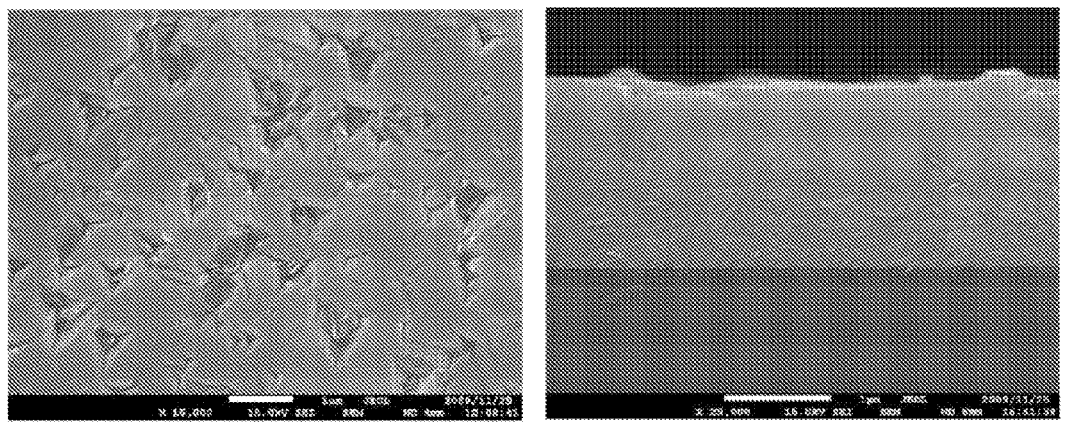
FIG. 13 is a surface SEM view and a cross-sectional SEM view of Comparative example 10.
Figure 14:
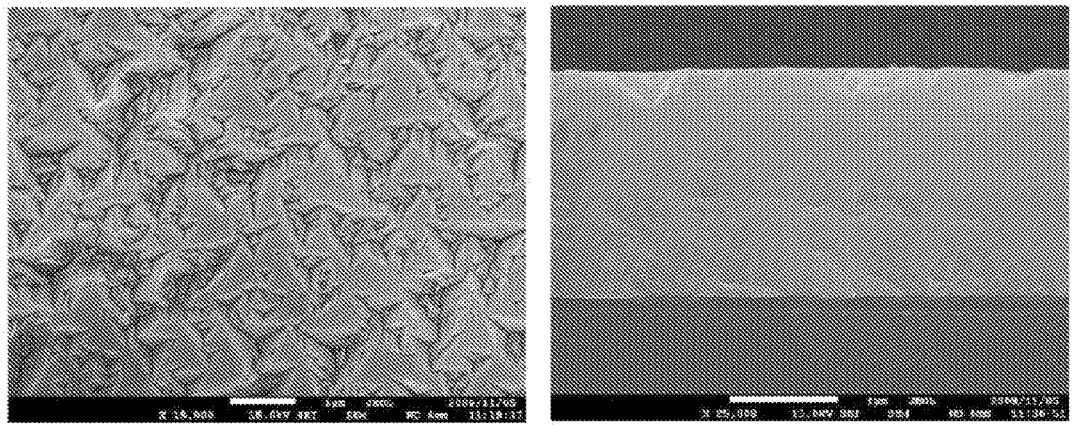
FIG. 14 is a surface SEM view and a cross-sectional SEM view of Comparative example 11.
Figure 15:
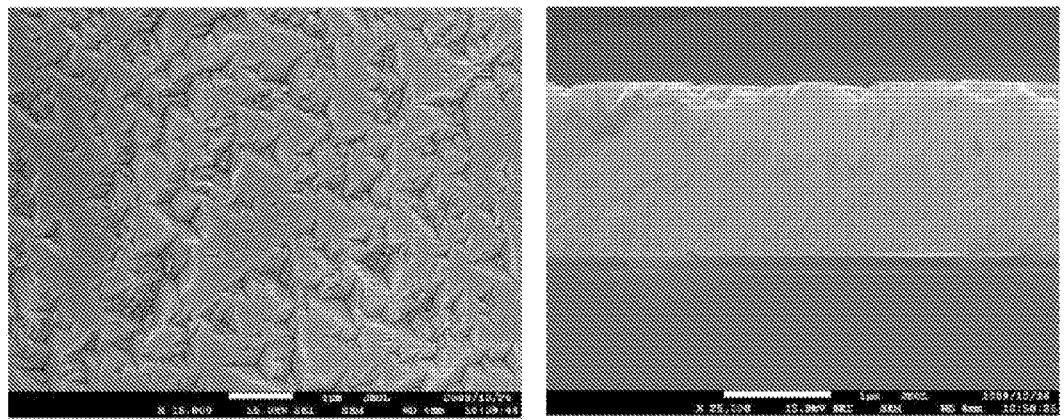
FIG. 15 is a surface SEM view and a cross-sectional SEM view of Comparative example 12.
Figure 16:
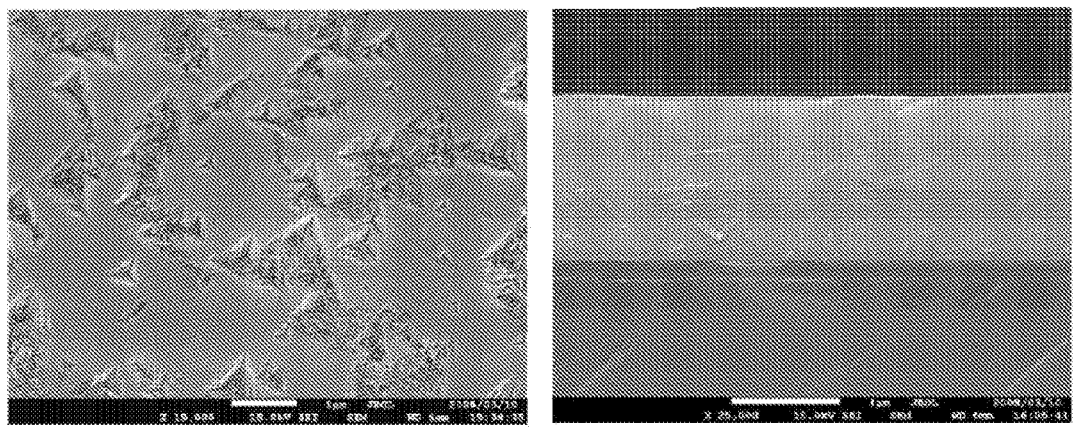
FIG. 16 is a surface SEM view and a cross-sectional SEM view of Comparative example 13.
Figure 17:
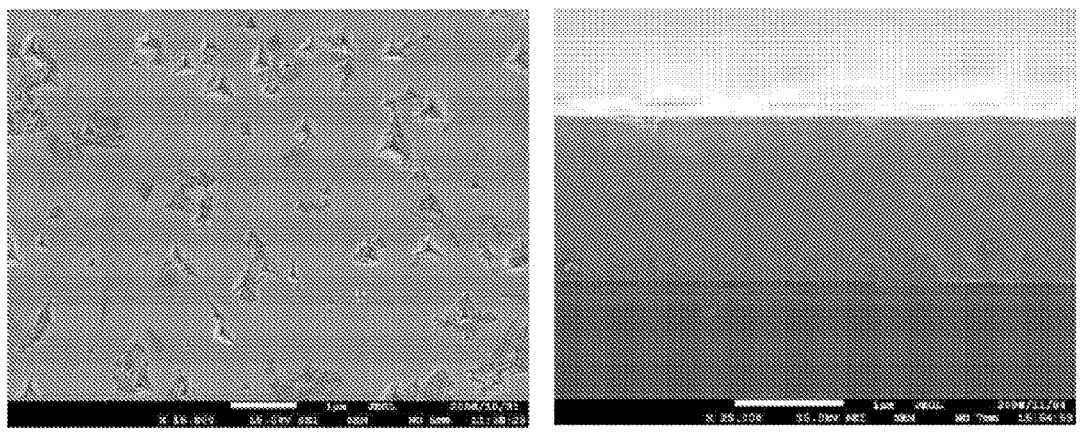
FIG. 17 is a surface SEM view and a cross-sectional SEM view of Comparative example 14.
Figure 18:
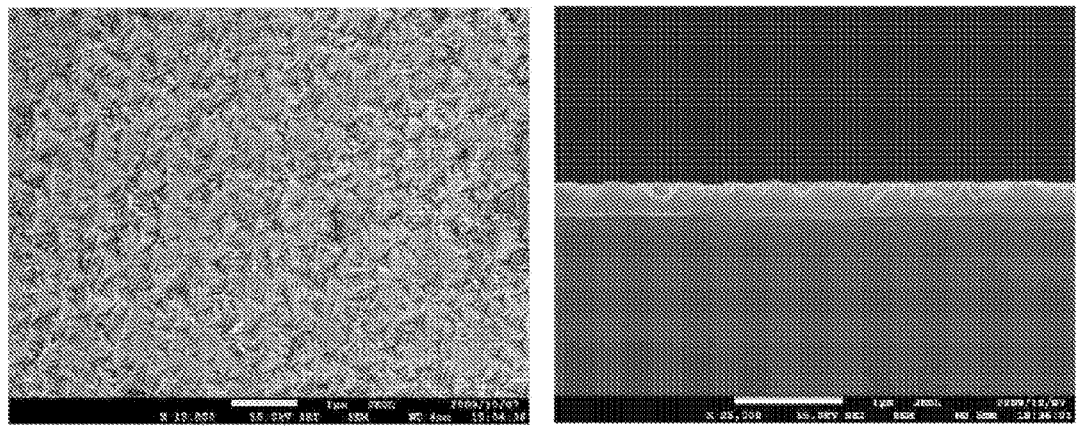
FIG. 18 is a surface SEM view and a cross-sectional SEM view of Comparative example 15.
Figure 19:
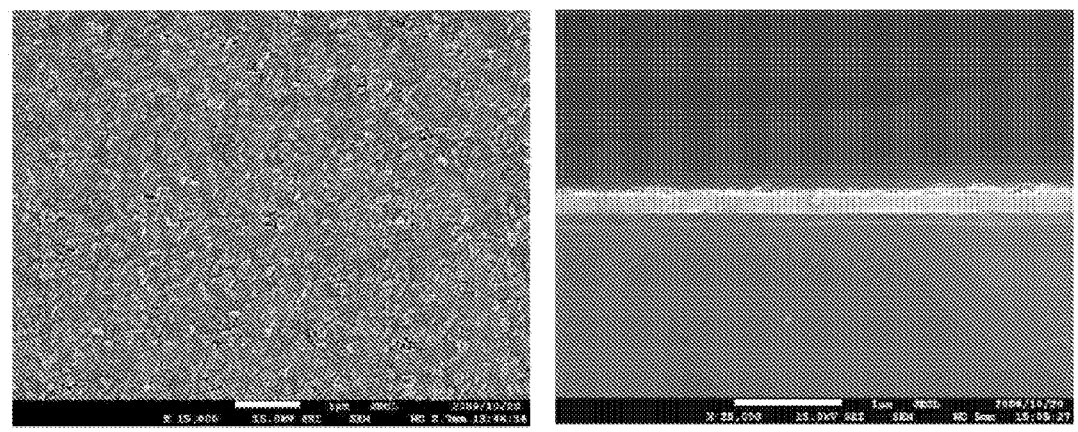
FIG. 19 is a surface SEM view and a cross-sectional SEM view of Comparative example 16.

FIG. 3 shows views illustrating the adjusting process of the base substrate in a case where the SOI substrate is used as the base substrate.

First, a SOI substrate 1 having a surface Si layer 3 in a predetermined thickness and an embedded insulating layer 4 is prepared. Subsequently, the thickness of the surface Si layer 3 of the SOI layer 1 is thinned down to a predetermined thickness of 6 nm or more according to a target substrate structure. Note that, this thinning process may be omitted. Next, the SOI substrate 1 is heated in a hydrocarbon-based gas atmosphere to convert the surface Si layer 3 into a single crystal 3C-SiC layer 5. Further, the epitaxial growing process is performed by having the single crystal 3C-SiC layer 5 as a seed layer 5.

The SOI substrate 1 is formed with an $SiO_2$ layer having a predetermined thickness around a surface of an Si base material 2 as the embedded insulating layer 4, and with the surface Si layer 3 having the predetermined thickness on the surface thereof. The thickness of the embedded insulating layer 4 is set to be about 1 to 200 nm.

Subsequently, according to the target substrate structure, the surface Si layer 3 of the SOI substrate 1 is thinned down to the predetermined thickness of 6 nm or more. The thinning is performed in a manner in which, for example, the SOI substrate 1 is heat treated in an oxidative atmosphere to be oxidized from the surface of the surface Si layer 3 by a predetermined depth so that the Si layer having a desired thickness is remained near an interface with the embedded insulating layer 4, and then an oxide layer generated on the surface thereof is etched by hydrofluoric acid or the like to be removed. Note that, this thinning process may be omitted.

Here, the thickness of the thinned surface Si layer 3 is preferred to be 6 nm or more. This is because it is difficult to have a thinned surface Si layer 3 having a thickness below 6 nm over the entire surface of a base substrate having a bore of 2 inches or larger, and deficiency in the surface Si layer 3 are caused in a part of the substrate in many cases with the thickness below 6 nm.

Subsequently, the SOI substrate 1 is heated in a hydrocarbon-based gas atmosphere to convert the surface Si layer 3 into the single crystal 3C-SiC layer 5.

The converting process can be performed by adjusting a temperature inside a heating furnace where an atmosphere control is available while switching the atmosphere gas (hydrogen gas and hydrocarbon gas) which is to be introduced into the heating furnace.

With such a device as described above, it is performed to install the SOI substrate 1 inside the heating furnace, the atmosphere temperature inside the heating furnace is increased while supplying mixture gas of hydrogen gas and hydrocarbon-based gas inside the heating furnace so as to convert the surface Si layer 3 of the SOI substrate 1 into the single crystal 3C-SiC layer 5.

Specifically, the SOI substrate 1 is installed inside the heating furnace, and the mixture gas in which hydrocarbon-based gas is mixed with hydrogen gas at a rate of 1 vol % is supplied inside the heating furnace. Further, simultaneous to this supply of the mixture gas, the atmosphere temperature inside the heating furnace is heated to 1100 to 1405° C., more preferably, to 1150 to 1300° C. By this heating, the surface Si layer 3 of the SOI substrate 1 is converted into the single crystal 3C-SiC layer 5.

Here, the hydrogen gas is carrier gas, and for hydrocarbon gas, propane gas may be used, for example. If a supply amount from the cylinder of hydrogen gas is 1000 cc/min, a supply amount from the cylinder of hydrocarbon gas is 10 cc/min.

The thickness of the single crystal 3C-SiC layer 5 formed in the converting process is preferably set to about 3 to 20 nm to reduce deficiency and defects therein and suppress degradation of crystallinity due to three-dimensional growth, the thickness is more preferably 4 to 10 nm and further more preferably 5 to 7 nm.

If the thickness of the converted single crystal 3C-SiC layer 5 exceeds 20 nm, nuclear growth occurs locally in an upper part of the single crystal 3C-SiC layer 5 to form grain aggregates, resulting in an unpreferred state in which a surface state is rough. Therefore, it becomes essential to set the thickness of the single crystal 3C-SiC layer 5 to 20 nm or less to prevent the quality of the single 3C-SiC film obtained from the epitaxial growth after the converting processing from degrading due to the influence of the rough surface, the thickness is more preferably 10 nm or less, and further more preferably 7 nm or lower.

On the other hand, the thickness of the converted single crystal 3C-SiC layer 5 set to 3 nm causes an unpreferred situation in which the single crystal 3C-SiC layer 5 sublimates in the early stage of epitaxial growth of the single crystal SiC layer 5 after the converting processing. Therefore, it becomes essential to set the thickness of the single crystal 3C-SiC layer 5 to 3 nm or more to prevent the quality of the single 3C-SiC film obtained from the epitaxial growth after the converting processing from degrading due to the influence of the sublimation, the thickness is more preferably 4 nm or more, and further more preferably 5 nm or more.

Through the epitaxial growth by having the single crystal 3C-SiC layer 5 as the seed layer on the SOI substrate 1 performed with the carbonization, a single crystal 3C-SiC layer is grown on the seed layer.

Alternatively, through using an Si substrate as the base substrate instead of the SOI substrate and performing the carbonization as described above, a single crystal 3C-SiC layer to serve as a seed layer may be formed on a surface layer part of the substrate to grow a single crystal 3C-SiC layer by the epitaxial growth on the seed layer.

In the epitaxial growing process, for example, the base substrate formed with the single crystal 3C-SiC layer 5 is arranged in a treatment chamber and material gas containing monomethylsilane gas is treated at a predetermined growing temperature while being supplied inside the treatment chamber at a predetermined flow rate (e.g., about 1 sccm) so that single crystal 3C-SiC is epitaxially grown by having the single crystal 3C-SiC layer as the seed layer. Note that, also when material gas such as silane gas and propane gas is supplied, or with additional carrier gas thereon such as hydrogen, completely the same effects of the present invention can be obtained.

Here, in the present invention, in the epitaxial growth, the first growing stage is performed in which the epitaxial growth is performed so that the single crystal 3C-SiC layer to be grown has a surface state having a surface with high flatness and surface pits scattering in the surface, and a second stage is performed in which the epitaxial growth is further performed to fill the surface pits of the single crystal 3C-SiC layer obtained in the first growing stage.

Here, the surface with high flatness generally intends a smooth surface other than the surface pits in the surface of the single crystal 3C-SiC layer obtained by the epitaxial growth and may have a wave configured by a gentle inclination at 10° or smaller with respect to a least square plane of the substrate surface. The least square plane is defined as a reference plane obtained by AFM (atomic force microscope) measuring the single crystal 3C-SiC surface and least square fitting data of the shape of the obtained surface. The AFM measurement is performed within a range of angle between 1 and 50 µm.

Through the first growing stage, a first single crystal 3C-SiC layer 6 is formed on the seed layer 5, and through the second growing stage, a second single crystal 3C-SiC layer 7 is further formed.

Specifically, in the first growing stage, the epitaxial growth is performed within a transport rate-limited range of the epitaxial growth, and in the second growing stage, the epitaxial growth is performed within a desorption rate-limited range of the epitaxial growth.

Figure 1:
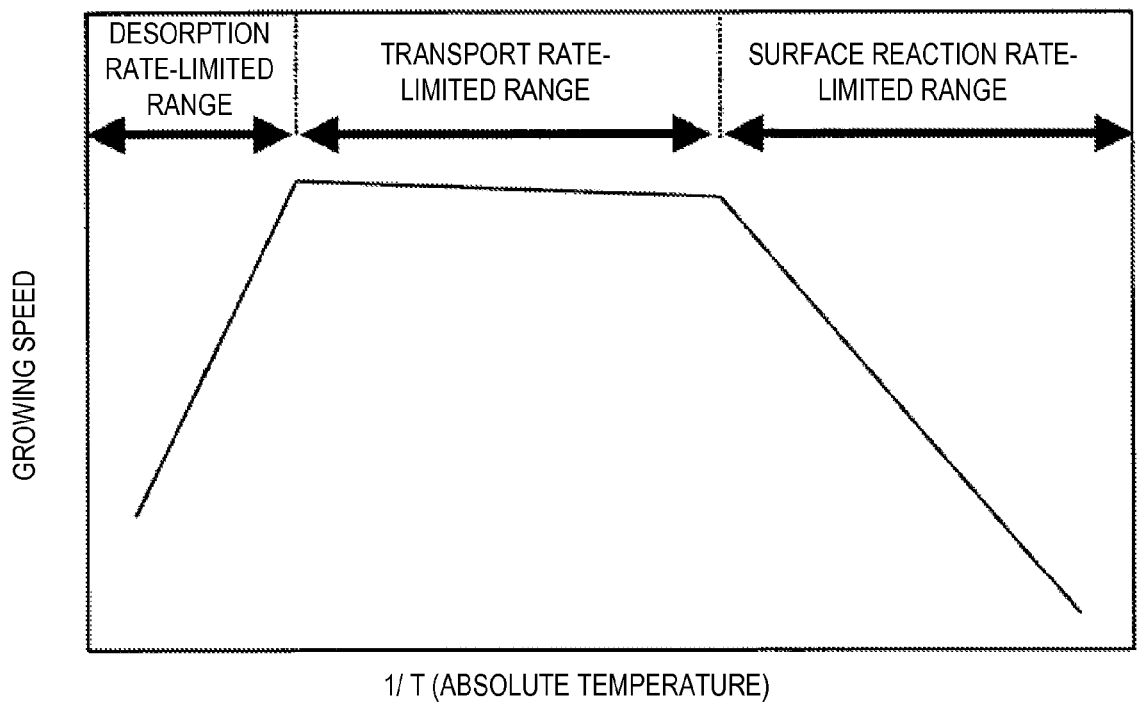
FIG. 1 is a graph showing a temperature dependence relation of a growing speed in an epitaxial growing reaction.

To describe further specifically, as described with reference to FIG. 1, a relation of the growing speed in general epitaxial growing reaction is shown that it depends on a temperature when a flow rate of reaction gas and a reaction pressure are under the same condition.

Thus, when the condition of the flow rate and the pressure is fixed in the epitaxial growth, there exist a surface reaction rate-limited range where the growing speed rapidly accelerates within a low temperature range according to the temperature increase, a transport rate-limited range located on the higher temperature side than the surface reaction rate-limited range and where the increase of the growing speed according to the temperature increase is extremely small (i.e., temperature dependency is low), and a desorption rate-limited range located on the higher temperature side than the transport rate-limited range and where the growing speed rapidly decelerates according to the temperature increase.

Within the surface reaction rate-limited range described above, a chemical reaction speed dominates the growing speed. When single crystal 3C-SiC was grown with the reaction rate-limit, the crystallinity of single crystal 3C-SiC was poor, the surface state was rough, and realistically, a quality appropriate for manufacturing a semiconductor device could not be obtained. Moreover, within the desorption rate-limited range, material molecules attach to locations other than the substrate and this causes a degraded material supply efficiency and an easier desorption of the material molecules which reached the substrate surface. Therefore, when single crystal 3C-SiC was grown with the desorption rate-limit, the crystallinity was improved compared to the surface reaction rate-limited range but a part of the crystal core grew abnormally and multiple protrusions grew on the surface, resulting in a rough surface state and the quality appropriate for manufacturing a semiconductor device not being not able to be obtained again.

Therefore, when the single crystal 3C-SiC substrate is manufactured as the foundation substrate of the semiconductor device or GaN, there has been no choice but to use the transport rate-limited range as the condition of epitaxial growth.

However, within the transport rate-limited range, although the surface roughness due to the crystallinity as within the surface reaction rate-limited range was not caused and the protrusions on the surface as the desorption rate-limited range was not generated, multiple tiny surface pits were formed on the surface, and surface defects due to the surface pits could not be avoided.

The present inventors have confirmed that the epitaxial growth to reduce the surface pits cannot be performed efficiently by only increasing the substrate temperature in stepwise fashion simply from low temperature to high temperature as it has been performed conventionally. Moreover, they have further carefully researched if particular condition setting exists in the epitaxial growth such that surface pits generated in the surface of the single crystal 3C-SiC layer in the process of its growth. In the research process, based on an idea that the reduction of the surface pits may be achieved by combining the epitaxial growth that has conventionally been performed only within the transport rate-limited range with the epitaxial growth within a different rate-limited range, experiments were performed repeatedly.

As a result, as a first stage, epitaxial growth was performed within the transport rate-limited range of epitaxial growth to have the single crystal 3C-SiC layer which is to be grown has the surface state described above having the surface with high flatness and the surface pits scattering in the surface, and then as a second stage, the desorption rate-limited range of epitaxial growth is used to further epitaxially grow single crystal 3C-SiC to fill the surface pits. As a result, it has been found that a single crystal 3C-SiC layer with flat surface, less surface pits, and good crystallinity can be obtained, and thus the present invention has been achieved.

Here, the plane shape of the surface pits formed in the first growing stage is determined based on a relation between a crystal structure of the single 3C-SiC layer to be grown and a crystal face arranged on the surface (i.e., orientation of the crystal). For example, if a main face orientation of single crystal 3C-SiC to be grown is (111), surface pits in triangle shape in plain view is formed. Alternatively, for example, if a main face orientation of single crystal 3C-SiC to be grown is (100), surface pits in square shape in plain view is formed.

Further, the thickness of the single crystal 3C-SiC layer formed in the first growing stage is preferably 500 nm or more, and the thickness of the single crystal 3C-SiC layer formed in the second growing stage is preferably 500 nm or more.

Thus, if the thickness of the single crystal 3C-SiC layer formed in the first growing stage is below 500 nm, the part where the surface pits are formed to scatter in the surface with high flatness will have a state in which 3C-SiC will not be formed efficiently and the base substrate will be exposed, and the surface pits will not be able to be filled by 3C-SiC even through the subsequent second growing stage. Therefore, by having the thickness of the single crystal 3C-SiC layer formed in the first growing stage to be 500 nm or more, the surface pits are filled in the subsequent second growing stage to resolve defects, and a single crystal 3C-SiC layer with less defects while securing the flatness can be obtained.

Further, if the thickness of the single crystal 3C-SiC layer formed in the second growing stage is below 500 nm, the part where the surface pits are formed to scatter in the surface with high flatness in the first growing stage will not be filled efficiently in the second growing stage. Therefore, by having the thickness of the single crystal 3C-SiC layer formed in the second growing stage to be 500 nm or more, the surface pits formed in the first growing stage are filled to resolve defects, and a single crystal 3C-SiC layer with less defects while securing the flatness can be obtained.

Particularly, if the main surface orientation of single crystal 3C-SiC to be grown is (111), there is a tendency that surface pits in triangle shape in plain view will be formed, the thickness will be below 500 nm, a 3C-SiC layer with good surface flatness will not be formed, and the surface pits cannot be filled efficiently in the second growing stage.

Moreover, the thickness of the single crystal 3C-SiC layer formed in the first growing stage is preferably 900 to 2900 nm, and the thickness of the single crystal 3C-SiC layer formed in the second growing stage is preferably 700 to 3700 nm.

Thus, in the first growing stage, a single crystal 3C-SiC layer can be formed so that surface pits that can be resolved in the second growing stage scatter in the surface with efficiently high flatness, and a single crystal 3C-SiC layer with less defects while securing the level of flatness can be obtained.

Moreover, in the second growing stage, the surface pits formed in the first growing stage are filled to resolve defects, and a single crystal 3C-SiC layer with less defects while securing the flatness can be obtained.

Here, in the first growing stage, it is only required to perform epitaxial growth within the transport rate-limited range described above. As the first growing stage, to epitaxially grow within the transport rate-limited range, although various conditions including the material gas, the atmosphere, the flow rate, the pressure, and the temperature are not intend to be limited, processing generally under the following conditions may be adopted.

Atmosphere: material gas of which a main component is monomethylsilane

Substrate Temperature: 970 to 1120° C.

Flow Rate: 1.0 to 30.0 sccm (the flow rate of monomethylsilane per wafer which is to be contained in the material gas)

Pressure: $1\times10^{-4}$ to $4\times10^{-1}$ Torr

The value of the pressure condition after calibration based on FIG. 24 described later is as follows.

Pressure: $9\times10^{-6}$ to $4\times10^{-1}$ Torr

Further, also in the second growing stage, although the various conditions including the material gas, the atmosphere, the flow rate, the pressure, and the temperature are not intend to be limited as long as the epitaxial growth can be performed within the desorption rate-limited range, processing generally under the following conditions may be adopted.

Atmosphere: material gas of which a main component is monomethylsilane

Substrate Temperature: 1100° C. to below the melting temperature of the base substrate Flow Rate: 0.1 to 6.0 sccm (the flow rate of monomethylsilane per wafer which is to be contained in the material gas)

Pressure: $1\times10^{-5}$ to $5\times10^{-4}$ Torr

The value of the pressure condition after calibration based on FIG. 24 described later is as follows.

Pressure: $1\times10^{-7}$ to $6\times10^{-5}$ Torr

Note that, by having the filming pressure in the first growing stage to be $4\times10^{-1}$ Torr or lower, discharge degradation of a resistance heater for heating a growing chamber can be suppressed. However, when a different heating method, such as an induction heating, is adopted, this restriction may be removed, and also when the filming pressure is increased and the film is formed within the transport rate-limited range, the effects of the present invention can be obtained.

Here, $1\times10^{-5}$ Torr which is the minimum value of the filming pressure ($1\times10^{-7}$ Torr after the calibration described later) only indicates the maximum performance of a turbomolecular pump for exhaustion from the growing chamber being used in the experiments, and also when the film is formed within the desorption rate-limited range with reduced filming pressure, the effects of the present invention can be obtained.

Here, monomethylsilane is gas with low dangerousness such as explosion, and particularly as the present invention, regarding the film formation which requires an operation of a gas supply valve, an operation of an exhaust valve, or an operation of a heater output during the film formation, it is extremely excellent in regard of low dangerousness. However, the SiC quality improving effect of the present invention itself can be obtained similarly also when different material gas, such as silane gas and propane gas, is used.

In the respective first and second growing stages, the thickness of single crystal 3C-SiC to be epitaxially grown can be adjusted by the length of the processing time.

The switch from the first growing stage to the second growing stage can be performed by at least one of the reduction of the material gas flow rate, the reduction of the filming pressure, and the increase of the substrate temperature, and it is not performed by changing simply from a low temperature growth to a high temperature growth as in the conventional art.

Thus, by fixing the composition of the material gas or the composition and mixture ratio of the material gas and the carrier gas, the pressure, and the temperature, and reducing the flow rate of the material gas, the switch from the transport rate-limit in the first growing stage to the desorption rate-limit in the second growing stage can be performed.

Thus, by performing the switch from the first growing stage to the second growing stage by reducing the material gas flow rate, the switch can smoothly be performed by only reducing the flow rate without changing the pressure or the temperature which takes time in changing the setting.

Further, by fixing the composition of the material gas or the composition and mixture ratio of the material gas and the carrier gas, the flow rate, and the temperature, and reducing the filming pressure, the switch from the transport rate-limit in the first growing stage to the desorption rate-limit in the second growing stage can also be performed.

Thus, by performing the switch from the first growing stage to the second growing stage through reducing the filming pressure, the switch can be performed by only reducing the pressure without changing the pressure or the temperature which takes time in changing the setting. Further, because the flow rate of the material gas is not changed, the atmosphere in which the epitaxial growth is performed is further stabilized, and the growth of the single crystal 3C-SiC layer is performed stably.

Further, by fixing the composition of the material gas or the composition and mixture ratio of the material gas and the carrier gas, the flow rate, and the pressure, and increasing the substrate temperature, the switch from the transport rate-limit in the first growing stage to the desorption rate-limit in the second growing stage can also be performed.

Thus, by performing the switch from the first growing stage to the second growing stage through increasing the substrate temperature, because the flow rate of the material gas is not changed, the atmosphere in which the epitaxial growth is performed is further stabilized, and the growth of the single crystal 3C-SiC layer is performed stably. Note that, the switch from the transport rate-limit in the first growing stage to the desorption rate-limit in the second growing stage may also be performed by combining the change of the flow rate of the material gas, the change of the filming pressure, and the change of the substrate temperature.

The single crystal 3C-SiC substrate obtained as above is formed with the single 3C-SiC layer by the epitaxial growth on the base substrate, and the number of the surface pit defects existing in the surface of the single crystal 3C-SiC layer can be made $8\times10^6/cm^2$ or lower immediately after the epitaxial growth.

Therefore, because defects due to the surface pits generated in the surface of the single crystal 3C-SiC layer in the process of epitaxial growth is small, a post-process is simplified, the cost is accordingly reduced, it becomes advantageous in terms of a quality stability, an yield rate and the like by reducing the influence factor on the quality, and the quality as the semiconductor device or the like can be secured.

Further, a different semiconductor film, such as a GaN layer, is further formed as needed by the epitaxial growth on the single crystal 3C-SiC layer formed by the epitaxial growth. Thus, for example, the single crystal 3C-SiC substrate obtained by the epitaxial growth is arranged inside a processing chamber, ammonia gas is supplied inside the processing chamber at a gas flow rate of about 100 to 1000 sccm, and processed at a temperature between 800 and 1405° C. while supplying organic Ga base gas, such as triethylgallium, trimethylgallium or the like, or organic Al base gas at a gas flow rate of about 1 sccm. Thereby, one of an AlN layer, a GaN layer, an AlGaN layer and the like or a nitride semiconductor layer having a laminated structure of these layers can be formed.

As above, in the method of manufacturing the single crystal 3C-SiC substrate of this embodiment, the first growing stage in which the single crystal 3C-SiC layer is formed to have a surface state having a surface with high flatness and surface pits scattering in the surface is performed, and the second stage in which the epitaxial growth is further performed to fill the surface pits of the single crystal 3C-SiC layer obtained in the first growing stage is performed. Thus, the single crystal 3C-SiC layer formed with surface pits and having a surface form secured in flatness in a part other than the surface pits is formed in the first growing stage, and in the second growing stage, the single crystal 3C-SiC layer with flat surface is formed by filling the surface pits to reduce the surface pits while maintaining the flatness of the surface. According to the above, because defects due to the surface pits generated in the surface of the single crystal 3C-SiC layer in the process of epitaxial growth becomes small, the post-process is simplified, the cost is accordingly reduced, it becomes advantageous in terms of the quality stability, the yield rate and the like by reducing the influence factor on the quality, and the quality as the semiconductor device or the like can be secured.

EXAMPLES

Next, examples of manufacturing the single crystal 3C-SiC substrate of the present invention are described.

An SOI substrate and an Si substrate are prepared as base substrates, and adjustments of the base substrates are performed under the following conditions, respectively.

♦ SOI Substrate
  Substrate Thickness: 725 μm
  Surface Si layer Thickness: 11 to 25 μm
  Embedded Insulating Layer Thickness: 100 to 200 nm
  Carbonization Condition: atmosphere gas is propane and hydrogen (carrier gas), temperature is 1200 to 1405° C., and time is 10 to 30 minutes Single Crystal 3C-SiC Seed Layer Thickness: 5 to 7 nm
♦ Si Substrate
  Substrate Thickness: 500 to 1000 μm
  Carbonization Conditions: atmosphere gas is propane and hydrogen (carrier gas), propane: hydrogen=1:100, temperature is 1200 to 1405° C., and time is 10 to 30 minutes
  Single Crystal 3C-SiC Seed Layer Thickness: 5 to 7 nm Subsequently, a single crystal 3C-SiC layer is grown by the epitaxial growth on the base substrate adjusted as described above. In this example, in the epitaxial growth, a device that can epitaxially grow a single base substrate in a single processing is used. Note that, the present invention is not limited to such a sheet-type epitaxial device.

Table 1 below is a list of conditions under which a single crystal 3C-SiC layer is grown by the epitaxial growth on the base substrate adjusted as above.

In Examples 1 to 3, epitaxial growths are respectively performed by having the SOI substrate as the base substrate and switching from the first growing stage (transport rate-limit) to the second growing stage (desorption rate-limit) through fixing a pressure condition and a flow rate of monomethylsilane per wafer and changing the temperature condition.

In Example 4, epitaxial growths are respectively performed by having the SOI substrate as the base substrate and switching from the first growing stage (transport rate-limit) to the second growing stage (desorption rate-limit) through fixing the pressure condition and changing the temperature condition and the flow rate of monomethylsilane per wafer.

In Examples 5 and 6, epitaxial growths are respectively performed by having the Si substrate as the base substrate and switching from the first growing stage (transport rate-limit) to the second growing stage (desorption rate-limit) through fixing the pressure condition and a flow rate of monomethylsilane per wafer and changing the temperature condition.

In Example 7, epitaxial growths are respectively performed by having the Si substrate as the base substrate and switching from the first growing stage (transport rate-limit) to the second growing stage (desorption rate-limit) through fixing the pressure condition and changing the temperature condition and the flow rate of monomethylsilane per wafer.

In Example 17, epitaxial growths are respectively performed by having the SOI substrate as the base substrate and switching from the first growing stage (transport rate-limit) to the second growing stage (desorption rate-limit) through fixing the temperature condition, substantially fixing the pressure condition to $5\times10^{-4}$ to $9\times10^{-4}$ Torr ($3\times10^{-5}$ to $1\times10^{-4}$ Torr after the calibration described later), and changing the flow rate of monomethylsilane per wafer.

In Example 18, epitaxial growths are respectively performed by having the SOI substrate as the base substrate and switching from the first growing stage (transport rate-limit) to the second growing stage (desorption rate-limit) through fixing the temperature condition and changing the pressure and the flow rate of monomethylsilane per wafer.

In Example 19, epitaxial growths are respectively performed by having the Si substrate as the base substrate and switching from the first growing stage (transport rate-limit) to the second growing stage (desorption rate-limit) through substantially fixing the pressure condition to $2\times10^{-4}$ to $5\times10^{-4}$ Torr ($1\times10^{-5}$ to $3\times10^{-5}$ Torr after the calibration described later), and changing the temperature condition and the flow rate of monomethylsilane per wafer.

Thus, in the first growing stage, the filming pressure is $9\times10^{-4}$ Torr ($1\times10^{-4}$ Torr after the calibration described later) or lower, and the switch from the first growing stage to the second growing stage is performed by either reducing the material gas flow rate or increasing the substrate temperature.

Moreover, in the first growing stage, the filming pressure is $1\times10^{-1}$ Torr or higher, and the switch from the first growing stage to the second growing stage is performed by at least reducing the filming pressure.

Note that, the rate-limiting stages are determined as follows.

Thus, a 3C-SiC epitaxial layer with approximately 1 μm thickness is grown on a 3C-SiC seed layer while fixing a material gas, an atmosphere, a flow rate, a pressure, and a temperature. Here, the material gas, the atmosphere, the flow rate, and the pressure are under the respective conditions used in the first and second growing stages described in the examples and comparative examples, and the growth is performed at various substrate temperatures with 10 to 50° C. differences therebetween.

Next, an average growing speed is calculated from dividing the thickness of the SiC layer by a holding time length, for each film forming condition. As for the substrate temperature, calibration curves of the substrate temperature and a heater temperature are acquired in advance by using, for example, a substrate with a thermocouple, and the substrate temperature is obtained based on the heater temperature during the growth by using the calibration curves, for each growing condition. Based on data of the obtained average growing speed and the substrate temperature, a curve for determining the rate-limiting stage as shown in FIG. 1 is formed. The created curve and the conditions of the first and second growing stages described in the examples and comparative examples are compared, and based on rate-limit determining conditions described in the term of "EFFECT OF THE INVENTION", the rate-limiting stage for each growing condition is determined.

All the comparative examples use the SOI substrate as the base substrate.

In Comparative Example 8, the epitaxial growth is performed only in the first stage with the transport rate-limit.

In Comparative Example 9, the epitaxial growth is performed only in the first stage with the desorption rate-limit.

In Comparative Example 10, the epitaxial growth in the first stage is performed with the reaction rate-limit, and the second stage with the desorption rate-limit.

In Comparative Example 11, the epitaxial growth in the first stage is performed with the transport rate-limit, then the flow rate of monomethylsilane is changed, and the epitaxial growth in the seconds stage is also performed with the transport rate-limit.

In Comparative Example 12, the epitaxial growth in the first stage is performed with the desorption rate-limit, and the second stage with the transport rate-limit. The thickness of the single crystal 3C-SiC layer after the first stage is finished is below 500 nm.

In Comparative Example 13, only the epitaxial growth in the first stage with the transport rate-limit is performed under a high pressure condition.

In Comparative Example 14, the epitaxial growth in the first stage is performed with the desorption rate-limit, and the second stage with the transport rate-limit. The thickness of the single crystal 3C-SiC layer after the first stage is finished below 500 nm.

In Comparative Examples 15 and 16, the epitaxial growth is performed only with the desorption rate-limit.

TABLE 1

| | | First Growing Stage | | | | | Second Growing Stage | | |
|---|---|---|---|---|---|---|---|---|---|
| | Base Substrate | Substrate Temp. (° C.) | Filming Pres. (Torr) | MMS (sccm) | Rate-Limiting Stage | SiC Film Thickness X (nm) | Substrate Temp. (° C.) | Filming Pres. (Torr) | MMS (sccm) |
| Example 1 | SOI | 990 | $5*10^{-4}$ | 3.0 | Trans. | 1300 | 1100 | $5*10^{-4}$ | 3.0 |
| Example 2 | SOI | 990 | $5*10^{-4}$ | 3.0 | Trans. | 1300 | 1100 | $5*10^{-4}$ | 3.0 |
| Example 3 | SOI | 1010 | $5*10^{-4}$ | 3.0 | Trans. | 1300 | 1100 | $5*10^{-4}$ | 3.0 |
| Example 4 | SOI | 990 | $5*10^{-4}$ | 3.0 | Trans. | 1900 | 1100 | $5*10^{-4}$ | 1.5 |
| Example 5 | Si | 990 | $5*10^{-4}$ | 3.0 | Trans. | 1500 | 1100 | $5*10^{-4}$ | 3.0 |
| Example 6 | Si | 990 | $5*10^{-4}$ | 3.0 | Trans. | 2200 | 1100 | $5*10^{-4}$ | 3.0 |
| Example 7 | Si | 990 | $5*10^{-4}$ | 3.0 | Trans. | 2200 | 1100 | $5*10^{-4}$ | 1.5 |
| Comparative Ex. 8 | SOI | 990 | $5*10^{-4}$ | 3.0 | Trans. | 1300 | — | — | — |
| Comparative Ex. 9 | SOI | 1070 | $5*10^{-4}$ | 3.0 | Desorp. | 800 | — | — | — |
| Comparative Ex. 10 | SOI | 950 | $5*10^{-4}$ | 3.0 | React. | N.D. | 1100 | $5*10^{-4}$ | 3.0 |
| Comparative Ex. 11 | SOI | 1050 | $5*10^{-4}$ | 3.0 | Trans. | 1100 | 1050 | $9*10^{-4}$ | 10.0 |
| Comparative Ex. 12 | SOI | 1100 | $5*10^{-4}$ | 2.0 | Desorp. | <500 | 990 | $5*10^{-5}$ | 3.0 |
| Comparative Ex. 13 | SOI | 1100 | $1*10^{-1}$ | 3.0 | Trans. | 1500 | — | — | — |
| Comparative Ex. 14 | SOI | 1100 | $5*10^{-4}$ | 2.0 | Desorp. | <500 | 1070 | $1*10^{-1}$ | 2.0 |
| Comparative Ex. 15 | SOI | 990 | $5*10^{-4}$ | 0.3 | Desorp. | <500 | — | — | — |
| Comparative Ex. 16 | SOI | 1070 | $5*10^{-4}$ | 1.0 | Desorp. | <500 | — | — | — |
| Example 17 | SOI | 1100 | $9*10^{-4}$ | 10.0 | Trans. | 1700 | 1100 | $5*10^{-4}$ | 3.0 |
| Example 18 | SOI | 1100 | $1*10^{-1}$ | 2.0 | Trans. | 900 | 1100 | $5*10^{-4}$ | 3.0 |
| Example 19 | Si | 1010 | $5*10^{-4}$ | 3.0 | Trans. | 2900 | 1100 | $2*10^{-4}$ | 1.5 |

| | Second Growing Stage | | Result | | |
|---|---|---|---|---|---|
| | Rate-Limiting Stage | SiC Film Thickness Y (nm) | SiC Film Thickness X + Y (nm) | Surface Pit Density (/cm$^2$) | Quality Determination |
| Example 1 | Desorp. | 1300 | 2600 | $8*10^6$ | ◉ |
| Example 2 | Desorp. | 2000 | 3300 | $4*10^6$ | ◉ |
| Example 3 | Desorp. | 3700 | 5000 | <$10^6$ | ◉ |
| Example 4 | Desorp. | 1500 | 3400 | $2*10^6$ | ◉ |
| Example 5 | Desorp. | 1400 | 2900 | $4*10^6$ | ◉ |
| Example 6 | Desorp. | 1400 | 3600 | $6*10^6$ | ◉ |
| Example 7 | Desorp. | 1200 | 3400 | $8*10^6$ | ◉ |

TABLE 1-continued

|  | | | | | |
|---|---|---|---|---|---|
| Comparative Ex. 8 | — | — | 1300 | >10^8 | X |
| Comparative Ex. 9 | — | — | 800 | Rough Surface | XX |
| Comparative Ex. 10 | Desorp. | N.D. | 1800 | >10^8 | X |
| Comparative Ex. 11 | Trans. | 1000 | 2100 | >10^8 | X |
| Comparative Ex. 12 | Trans. | 1600 | 1600 | >10^8 | X |
| Comparative Ex. 13 | — | — | 1500 | >10^8 | X |
| Comparative Ex. 14 | Trans. | 1500 | 1500 | >10^8 | X |
| Comparative Ex. 15 | — | — | <500 | >10^8 | X |
| Comparative Ex. 16 | — | — | <500 | Rough Surface | XX |
| Example 17 | Desorp. | 1700 | 3400 | <10^6 | ◎ |
| Example 18 | Desorp. | 1700 | 2600 | <10^6 | ◎ |
| Example 19 | Desorp. | 700 | 3600 | 2 * 10^6 | ◎ |

◎: Pit Density <8 * 10^6 (/cm$^2$)
○: Pit Density >8 * 10^6, <1 * 10^7 (/cm$^2$)
Δ: Pit Density >1 * 10^7, <1 * 10^8 (/cm$^2$)
X: Pit Density >1 * 10^8 (/cm$^2$)
XX: Rough Surface, No Flat Surface Here, the filming pressures in Table 1 is read values of a Baratron vacuum gauge, and reliability in accuracy was considered not high, and this propensity was considered to be strong particularly on the lower pressure side. Therefore, the calibration curves for the filming pressure were obtained, and the calibrations of the values were performed.

The calibration curves were acquired by using also a hot cathode vacuum gauge with high reliability in its measurement value to measure the pressures at the exit of the processing chamber when the material gas is supplied inside the processing chamber at respective flow rates at predetermined temperatures between 950° C. and 1100° C., and plot the pressure change with respect to the flow rate of the material gas by having each temperature as the substrate temperature.

Figure 23:
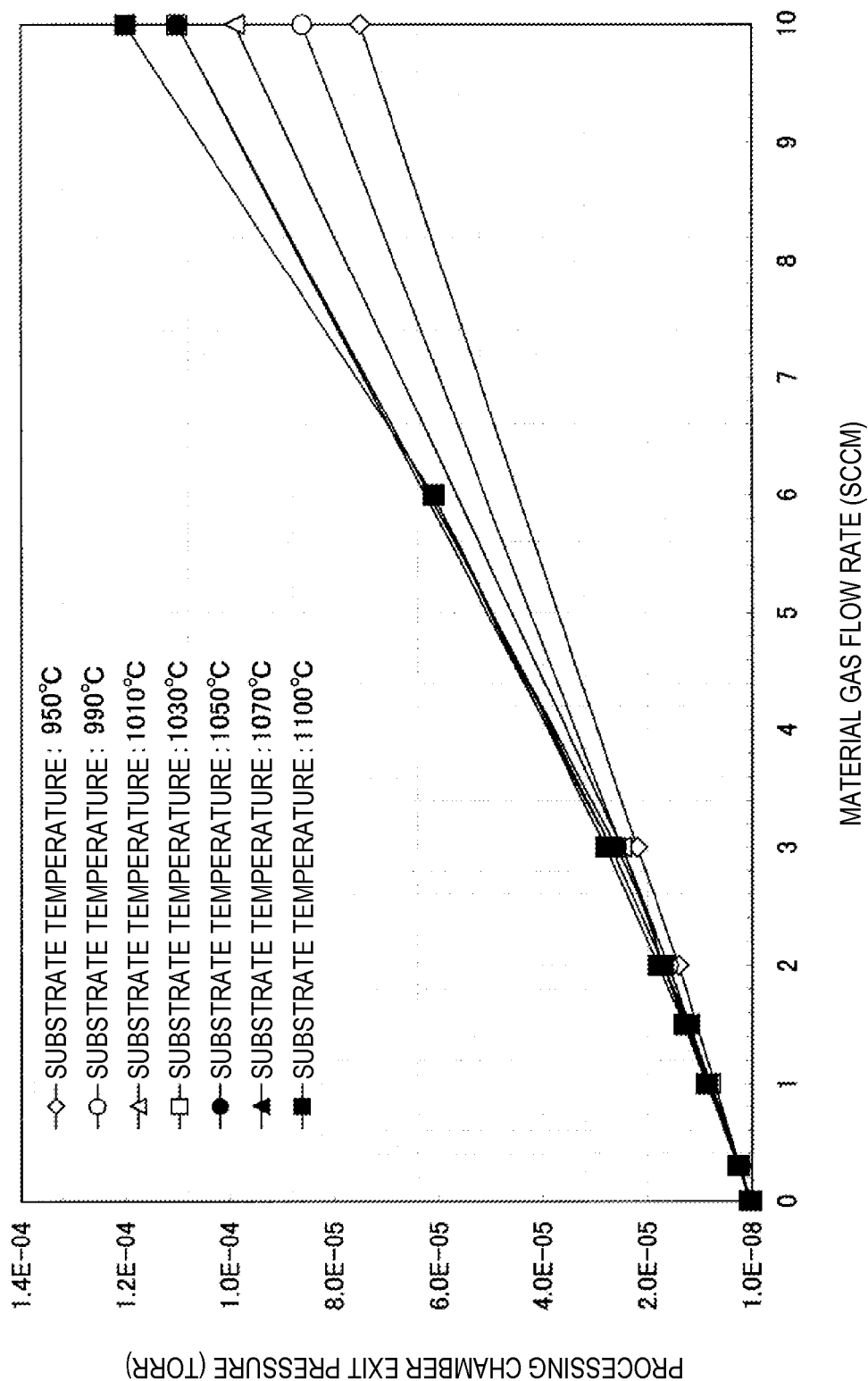
FIG. 23 is calibration curves showing changes of a processing chamber pressure against a material gas flow rate.

FIG. 23 is configuration curves obtained as described above.

The following Table 2 is a list of the conditions after the calibration required for the filming pressure in Table 1 is performed based on the calibration curves thus obtained.

TABLE 2

| | Base Substrate | First Growing Stage | | | | | Second Growing Stage | | | | |
|---|---|---|---|---|---|---|---|---|---|---|---|
| | | Substrate Temp. (° C.) | Filming Pres. (Torr) | MMS (sccm) | Rate-Limiting Stage | SiC Film Thickness X (nm) | Substrate Temp. (° C.) | Filming Pres. (Torr) | MMS (sccm) | Rate-Limiting Stage | SiC Film Thickness Y (nm) |
| Example 1 | SOI | 990 | 3 * 10^−5 | 3.0 | Trans. | 1300 | 1100 | 3 * 10^−5 | 3.0 | Desorp. | 1300 |
| Example 2 | SOI | 990 | 3 * 10^−5 | 3.0 | Trans. | 1300 | 1100 | 3 * 10^−5 | 3.0 | Desorp. | 2000 |
| Example 3 | SOI | 1010 | 3 * 10^−5 | 3.0 | Trans. | 1300 | 1100 | 3 * 10^−5 | 3.0 | Desorp. | 3700 |
| Example 4 | SOI | 990 | 3 * 10^−5 | 3.0 | Trans. | 1900 | 1100 | 1 * 10^−5 | 1.5 | Desorp. | 1500 |
| Example 5 | Si | 990 | 3 * 10^−5 | 3.0 | Trans. | 1500 | 1100 | 3 * 10^−5 | 3.0 | Desorp. | 1400 |
| Example 6 | Si | 990 | 3 * 10^−5 | 3.0 | Trans. | 2200 | 1100 | 3 * 10^−5 | 3.0 | Desorp. | 1400 |
| Example 7 | Si | 990 | 3 * 10^−5 | 3.0 | Trans. | 2200 | 1100 | 1 * 10^−5 | 1.5 | Desorp. | 1200 |
| Comparative Ex. 8 | SOI | 990 | 3 * 10^−5 | 3.0 | Trans. | 1300 | — | — | — | — | — |
| Comparative Ex. 9 | SOI | 1070 | 3 * 10^−5 | 3.0 | Desorp. | 800 | — | — | — | — | — |
| Comparative Ex. 10 | SOI | 950 | 2 * 10^−5 | 3.0 | React. | N.D. | 1100 | 3 * 10^−5 | 3.0 | Desorp. | N.D. |
| Comparative Ex. 11 | SOI | 1050 | 3 * 10^−5 | 3.0 | Trans. | 1100 | 1050 | 1 * 10^−4 | 10.0 | Trans. | 1000 |
| Comparative Ex. 12 | SOI | 1100 | 2 * 10^−5 | 2.0 | Desorp. | <500 | 990 | 3 * 10^−5 | 3.0 | Trans. | 1600 |
| Comparative Ex. 13 | SOI | 1100 | 1 * 10^−1 | 3.0 | Trans. | 1500 | — | — | — | — | — |
| Comparative Ex. 14 | SOI | 1100 | 2 * 10^−5 | 2.0 | Desorp. | <500 | 1070 | 1 * 10^−1 | 2.0 | Trans. | 1500 |
| Comparative Ex. 15 | SOI | 990 | 2 * 10^−6 | 0.3 | Desorp. | <500 | — | — | — | — | — |
| Comparative Ex. 16 | SOI | 1070 | 9 * 10^−6 | 1.0 | Desorp. | <500 | — | — | — | — | — |
| Example 17 | SOI | 1100 | 1 * 10^−4 | 10.0 | Trans. | 1700 | 1100 | 3 * 10^−5 | 3.0 | Desorp. | 1700 |
| Example 18 | SOI | 1100 | 1 * 10^−1 | 2.0 | Trans. | 900 | 1100 | 3 * 10^−5 | 3.0 | Desorp. | 1700 |
| Example 19 | Si | 1010 | 3 * 10^−5 | 3.0 | Trans. | 2900 | 1100 | 1 * 10^−5 | 1.5 | Desorp. | 700 |

| | Result | | | |
|---|---|---|---|---|
| | SiC Film Thickness X + Y (nm) | Surface Pit Density (/cm$^2$) | Quality Determination | Remarks |
| Example 1 | 2600 | 8 * 10^6 | ◎ | Trans. -> Desorp. By Temp. Change |
| Example 2 | 3300 | 4 * 10^6 | ◎ | Trans. -> Desorp. By Temp. Change |
| Example 3 | 5000 | <10^6 | ◎ | Trans. -> Desorp. By Temp. Change |
| Example 4 | 3400 | 2 * 10^6 | ◎ | Trans. -> Desorp. By Temp. and Flow Rate Change |
| Example 5 | 2900 | 4 * 10^6 | ◎ | Trans. -> Desorp. By Temp. Change |

TABLE 2-continued

| | | | | |
|---|---|---|---|---|
| Example 6 | 3600 | $6 * 10^6$ | ⊚ | Trans. -> Desorp. By Temp. Change |
| Example 7 | 3400 | $8 * 10^6$ | ⊚ | Trans. -> Desorp. By Temp. and Flow Rate Change |
| Comparative Ex. 8 | 1300 | $>10^8$ | X | Only First In Trans. |
| Comparative Ex. 9 | 800 | Rough Surface | XX | Only First In Desorp. |
| Comparative Ex. 10 | 1800 | $>10^8$ | X | First In React. + Second In Desorp. |
| Comparative Ex. 11 | 2100 | $>10^8$ | X | First In Trans. + Second In Trans. (High Flow Rate) |
| Comparative Ex. 12 | 1600 | $>10^8$ | X | First In Desorp. (First Layer Film Thickness <500 nm) + Second In Trans. |
| Comparative Ex. 13 | 1500 | $>10^8$ | X | Only First In Trans. (High Pressure) |
| Comparative Ex. 14 | 1500 | $>10^8$ | X | First In Desorp. (First Layer Film Thickness <500 nm) + Second In Trans. |
| Comparative Ex. 15 | <500 | $>10^8$ | X | Only First In Desorp. (Low Flow Rate) |
| Comparative Ex. 16 | <500 | Rough Surface | XX | Only First In Desorp. (High Temp., Low Flow Rate) |
| Example 17 | 3400 | $<10^6$ | ⊚ | Trans. -> Desorp. By Flow Rate Change |
| Example 18 | 2600 | $<10^6$ | ⊚ | Trans. -> Desorp. By Pressure and Flow Rate Change |
| Example 19 | 3600 | $2 * 10^6$ | ⊚ | Trans. -> Desorp. By Temp. and Flow Rate Change |

⊚: Surface Pit Density $<8 * 10^6$ (/cm$^2$)
○: Surface Pit Density $>8 * 10^6$, $<1 * 10^7$ (/cm$^2$)
Δ: Surface Pit Density $>1 * 10^7$, $<1 * 10^8$ (/cm$^2$)
X: Surface n Pit Density $>1 * 10^8$ (/cm$^2$)
XX: Rough Surface, No Flat Surface FIGS. 4 to 10 respectively show surface states and surface layer parts of the single crystal 3C-SiC substrates obtained in Examples 1, 2, 3, 4, 5, 6, and 7, and cross-sectional SEM views of the 3C-SiC layers of the respective surface layer parts.

FIGS. 11 to 19 respectively show surface states of the single crystal 3C-SiC substrates obtained in Comparative Examples 8, 9, 10, 11, 12, 13, 14, 15, and 16, and cross-sectional SEM views of the 3C-SiC layers of the respective surface layer parts.

Figure 20:
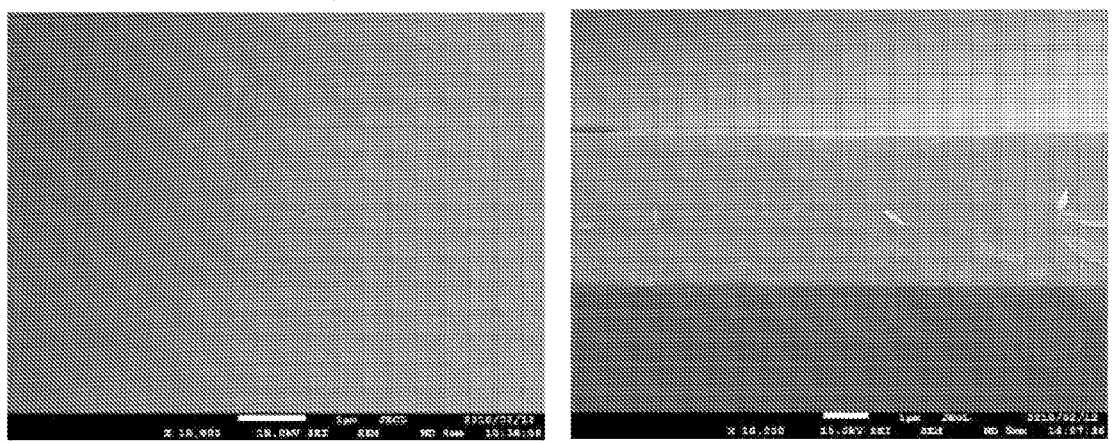
FIG. 20 is a surface SEM view and a cross-sectional SEM view of Example 17.
Figure 21:
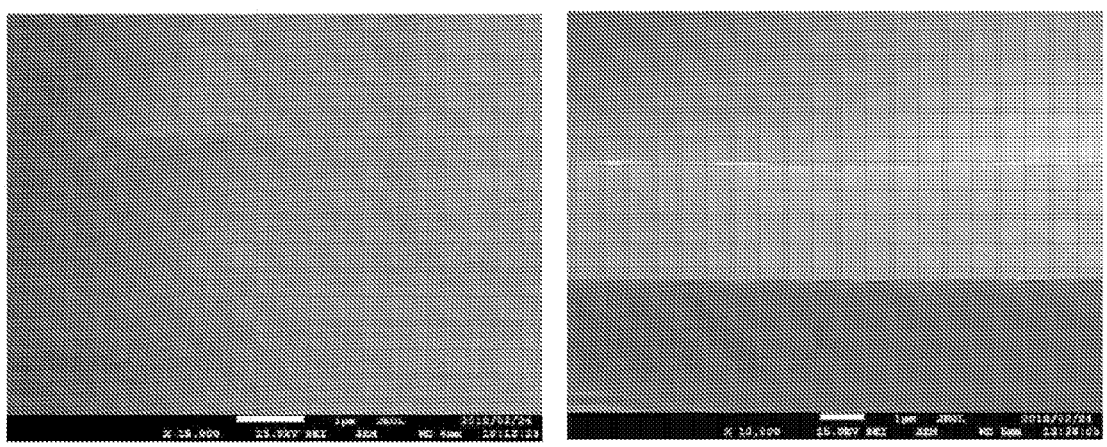
FIG. 21 is a surface SEM view and a cross-sectional SEM view of Example 18.
Figure 22:
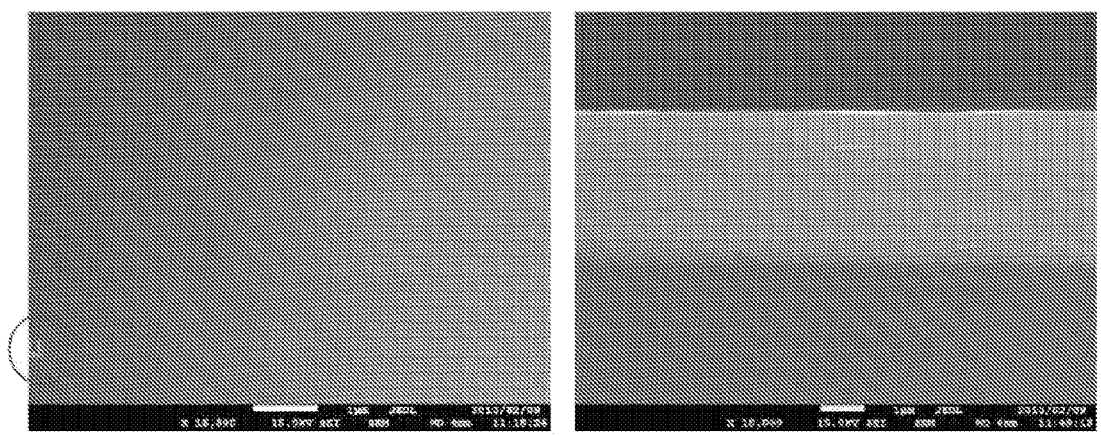
FIG. 22 is a surface SEM view and a cross-sectional SEM view of Example 19.

FIGS. 20 to 22 respectively show surface states of the single crystal 3C-SiC substrates obtained in Examples 17 to 19, and cross-sectional SEM views of the 3C-SiC layers of the respective surface layer parts.

The Tables 1 and 2 indicate, in each of Examples 1 to 7 and 17 to 19 and Comparative Examples 8 to 16 under the conditions, film thickness of each single crystal 3C-SiC layer in the first stage (X), film thickness of each single crystal 3C-SiC layer in the second stage (Y), a total film thickness thereof (X+Y), a density of triangle shape defects (surface pits) in each surface (/cm$^2$), and a result of quality determination of the surface state of each single crystal 3C-SiC substrate.

Note that, the film thickness of the single crystal 3C-SiC layer is obtained by measuring from the cross-sectional SEM view. The surface pit density of the single 3C-SiC layer is obtained by measuring the number of pits per unit area from the surface SEM view.

Based on the results in Examples 1 to 7 and 17 to 19, it can be seen that even when the SOI substrate is used as the base substrate or the Si substrate is used as the same, the single crystal 3C-SiC layer with small number of the surface pits, low surface pit density, good crystallinity, and efficient film thickness is obtained in any case.

On the other hand, based on the results in Comparative Examples 8 to 16, it can be seen that the single crystal 3C-SiC layer where many surface pits and protrusions exist, the surface state is clearly poor, and the crystallinity is also poor is obtained in any case.

Industrial Applicability

The present invention can be applied to manufacturing of a semiconductor substrate which is used for a large-scale integrated circuit and the like, for example.

Description of Reference Numerals

1 SOI Substrate
2 Si Base Material
3 Surface Si Layer
4 Embedded Insulating Layer (Oxide Layer)
5 Seed Layer (Single Crystal 3C-SiC layer)
6 Primary Crystal 3C-SiC Layer
7 Secondary Crystal 3C-SiC Layer

What is claimed is:

1. A method of manufacturing a single crystal 3C-SiC substrate where a single crystal 3C-SiC layer is formed on a base substrate by epitaxial growth, comprising:
   a first growing stage of forming the single crystal 3C-SiC layer to have a surface state configured with a surface with high flatness and surface pits scattering in the surface; and
   a second growing stage of further epitaxially growing the single crystal 3C-SiC layer obtained in the first growing stage so as to fill the surface pits,
   wherein the epitaxial growth in the first growing stage is performed within a transport limited range, and the epitaxial growth in the second growing stage is performed within a desorption limited range.

2. A method of manufacturing a single crystal 3C-SiC substrate where a single crystal 3C-SIC layer is formed on a base substrate by epitaxial growth, comprising:
   a first growing stage of forming the single crystal 3C-SIC layer to have a surface state configured with a surface with high flatness and surface pits scattering in the surface; and a second growing stage of further epitaxially growing the single crystal 3C-SiC layer obtained in the first growing stage so as to fill the surface pits, wherein the first growing stage is switched to the second growing stage by at least one of a reduction of a flow rate of material gas, a reduction of a filming pressure, and an increase of a substrate temperature.

3. The method of manufacturing the single crystal 3C-SiC substrate of claim 1, wherein the base substrate configured with semiconductor crystals containing Si in at least a surface layer part is used.

4. The method of manufacturing the single crystal 3C-SiC substrate of claim 1, wherein the base substrate configured with Si in at least a surface layer part is used, Si of the surface layer part of the base substrate is carbonized to be converted into an SiC layer, and epitaxial growths of the first and second growing stages are performed by having the SiC layer as a seed layer.

5. The method of manufacturing the single crystal 3C-SiC substrate of claim 1, wherein a main component of material gas when the single crystal 3C-SiC layer is formed on the base substrate by the epitaxial growth is monomethylsilane.

6. A method of manufacturing a single crystal 3C-SiC substrate where a single crystal 3C-SiC layer is formed on a base substrate by epitaxial growth, comprising:

a first growing stage of forming the single crystal 3C-SiC layer to have a surface state configured with a surface with high flatness and surface pits scattering in the surface; and a second growing stage of further epitaxially growing the single crystal 3C-SiC layer obtained in the first growing stage so as to fill the surface pits, a main component of material gas when the single crystal 3C-SiC layer is formed on the base substrate by the epitaxial growth is monomethylsilane, wherein in the first growing stage, a substrate temperature is between 970 and 1120° C., a flow rate of monomethylsilane to be contained in the material gas is between 1.0 and 30.0 sccm per wafer, and a filming pressure exceeds exceeds $9 \times 10^{-6}$ Torr and is $4 \times 10^{-1}$ Torr or below, and wherein in the second growing stage, the flow rate of monomethylsilane to be contained in the material gas is 6.0 sccm or lower per wafer, the substrate temperature is between 1100° C. and below a melting temperature of the base substrate, and the filming pressure is between $1 \times 10^{-7}$ and $6 \times 10^{-5}$ Torr.

7. The method of manufacturing the single crystal 3C-SiC substrate of claim 2, wherein the base substrate configured with semiconductor crystals containing Si in at least a surface layer part is used.

8. The method of manufacturing the single crystal 3C-SiC substrate of claim 2, wherein the base substrate configured with Si in at least a surface layer part is used, Si of the surface layer part of the base substrate is carbonized to be converted into an SiC layer, and epitaxial growths of the first and second growing stages are performed by having the SiC layer as a seed layer.

9. The method of manufacturing the single crystal 3C-SiC substrate of claim 3, wherein the base substrate configured with Si in at least a surface layer part is used, Si of the surface layer part of the base substrate is carbonized to be converted into an SiC layer, and epitaxial growths of the first and second growing stages are performed by having the SiC layer as a seed layer.

10. The method of manufacturing the single crystal 3C-SiC substrate of claim 7, wherein the base substrate configured with Si in at least a surface layer part is used, Si of the surface layer part of the base substrate is carbonized to be converted into an SiC layer, and epitaxial growths of the first and second growing stages are performed by having the SiC layer as a seed layer.

11. The method of manufacturing the single crystal 3C-SiC substrate of claim 2, wherein a main component of material gas when the single crystal 3C-SiC layer is formed on the base substrate by the epitaxial growth is monomethylsilane.

12. The method of manufacturing the single crystal 3C-SiC substrate of claim 3, wherein a main component of material gas when the single crystal 3C-SiC layer is formed on the base substrate by the epitaxial growth is monomethylsilane.

13. The method of manufacturing the single crystal 3C-SiC substrate of claim 7, wherein a main component of material gas when the single crystal 3C-SiC layer is formed on the base substrate by the epitaxial growth is monomethylsilane.

14. The method of manufacturing the single crystal 3C-SiC substrate of claim 4, wherein a main component of material gas when the single crystal 3C-SiC layer is formed on the base substrate by the epitaxial growth is monomethylsilane.

15. The method of manufacturing the single crystal 3C-SiC substrate of claim 8, wherein a main component of material gas when the single crystal 3C-SiC layer is formed on the base substrate by the epitaxial growth is monomethylsilane.

16. The method of manufacturing the single crystal 3C-SiC substrate of claim 9, wherein a main component of material gas when the single crystal 3C-SiC layer is formed on the base substrate by the epitaxial growth is monomethylsilane.

17. The method of manufacturing the single crystal 3C-SiC substrate of claim 10, wherein a main component of material gas when the single crystal 3C-SiC layer is formed on the base substrate by the epitaxial growth is monomethylsilane.

18. The method of manufacturing the single crystal 3C-SiC substrate of any one of claims 1-6 and 7-17, wherein a main surface orientation of the single crystal 3C-SiC layer formed by the epitaxial growth on the base substrate is (111).

* * * * *